United States Patent
Coleman

(10) Patent No.: US 10,634,818 B2
(45) Date of Patent: Apr. 28, 2020

(54) STORM WARNING METHOD AND APPARATUS

(71) Applicant: Ernest Wilson Coleman, Phoenix, AZ (US)

(72) Inventor: Ernest Wilson Coleman, Phoenix, AZ (US)

( * ) Notice: Subject to any disclaimer, the term of this patent is extended or adjusted under 35 U.S.C. 154(b) by 214 days.

(21) Appl. No.: 15/853,497

(22) Filed: Dec. 22, 2017

(65) Prior Publication Data

US 2019/0196062 A1    Jun. 27, 2019

(51) Int. Cl.
*G01W 1/16*    (2006.01)
*G01R 29/08*    (2006.01)

(52) U.S. Cl.
CPC .......... *G01W 1/16* (2013.01); *G01R 29/0842* (2013.01); *G01W 2203/00* (2013.01)

(58) Field of Classification Search
CPC . G01W 1/16; G01W 2203/00; G01R 29/0842
See application file for complete search history.

(56) References Cited

U.S. PATENT DOCUMENTS

| | | | | |
|---|---|---|---|---|
| 3,715,660 A | * | 2/1973 | Ruhnke | G01S 11/02 324/72 |
| 4,023,408 A | * | 5/1977 | Ryan | G01R 29/0842 73/170.24 |
| 6,215,294 B1 | * | 4/2001 | Coleman | G01R 29/0842 324/72 |

* cited by examiner

*Primary Examiner* — Mischita L Henson

(57) ABSTRACT

A system to detect, track and display lightning activity is disclosed. The system is designed to be contained in a single radome package. An electric field antenna and a pair of magnetic field antennas receive the field components associated with lightning activity. The receiver, processor and control circuitry are located in the base of the radome which operates on the field signals. The processor determines the azimuth angles to the lightning activity based on the sampled field data and determines the range based on both the inverse of the magnetic field and the rise time of the electric field components. The sampled field data is grouped and assigned levels of intensity. The angle, range and intensity information is transmitted to a display where it can be displayed in a variety of formats.

9 Claims, 9 Drawing Sheets

FIG. 7

ARINC Data Format from RX1/RX2 Receivers

| 7 | 6 | 5 | 4 | 3 | 2 | 1 | 0 |
|---|---|---|---|---|---|---|---|
| b8 | | | ARINC 429 Label Byte | | | | b1 |
| b16 | | | Data byte 1 | | | | b9 |
| b24 | | | Data byte 2 | | | | b17 |
| b32 | | | Data byte 3 | | | | b25 |

ARINC Transmitter TX1 Word Formats

| 15 | 14 | 13 | 12 | 11 | 10 | 9 | 8 | 7 | 6 | 5 | 4 | 3 | 2 | 1 | 0 |
|----|----|----|----|----|----|---|---|---|---|---|---|---|---|---|---|
| b16 | | | | | | b9 | b8 | ARINC Label | | | | | | | b1 |
| P | b31 | | | | | | | | | | | | | | b17 |

STORM WARNING METHOD AND APPARATUS

BACKGROUND OF THE INVENTION

Field of Invention

This invention relates to an apparatus and method for displaying the lightning rate of activity and location from the observers.

Description of Prior Art

Thunder storms create great dangers particularly to air travel due to the turbulence and electrical activity (lightning). Pilots of aircraft need to track, predicted and avoided thunder storms. The electrical signals generated by thunderstorms vary greatly during the life of the thunderstorm. During the early stages of building thunderstorms, the number of electrical signals will increase. This is the stage of high turbulence. The number of electrical signals generated during the mature stage is also very high as is the ending stage of a thunderstorm. Weak storm fronts with little turbulence generate electrical signals but with very less frequent rate. The detection, recognition, accurate measurement and analysis of these electrical signals provide a basis for storm tracking, avoidance, etc.

Lightning flashes are composed of a series of high current lightning strokes, each stroke being proceeded by a lower current discharge called a leader. The duration of electrical activity associated with a lightning stroke varies but in many instances last as much as a hundred microseconds. The initial rise time of electrical signals associated with a lightning stroke almost never exceeds five microseconds. Following the first peak of the electrical signals of a lightning stroke, lesser signals of sub-microsecond duration but with fast rise times (of five microseconds or less) will occur. Several lightning detection systems have been created-for example, in U.S. Pat. No. 4,422,037 (1983), U.S. Pat. No. 4,672,305 (1987) both to Coleman, U.S. Pat. No. 4,639,666 (1987) to Strosser et al., U.S. Pat. No. 4,684,951 (1987) to Baumer, U.S. Pat. No. 4,803,421 (1989) and U.S. Pat. No. 4,873,483 (1989) both to Ostrander, U.S. Pat. No. 4,831,362 (1989) to Tsaprazis, U.S. Pat. No. 4,801,942 (1989), U.S. Pat. No. 4,972,195 (1990), and U.S. Pat. No. 5,057,820 (1991) all to Markson et al., U.S. Pat. No. 5,168,212 (1992) to Byerley, III et al., U.S. Pat. No. 5,263,368 (1993) to Breitmeier et al., U.S. Pat. No. 5,295,071 (1994) toKuzma et al., U.S. Pat. No. 5,303,152 (1994) to Moses et al, U.S. Pat. No. 5,295,072 (1994) to Stevens, Jr. et al, U.S. Pat. Nos. 5,245,274, 5,408,175 (1995), U.S. Pat. No. 5,500,602 (1996), U.S. Pat. No. 5,502,371 (1996), U.S. Pat. No. 5,504,421 (1996), and U.S. Pat. No. 5,500,586 (1996) all to Youngqvist, U.S. Pat. No. 5,396,220 (1995) to Markson et al, U.S. Pat. No. 5,528,494 (1996) and U.S. Pat. No. 5,537,318 (1996) both to Moses, U.S. Pat. No. 5,441,501 (1996) to Shaver et al, U.S. Pat. No. 5,610,813 (1997) to Greenwald, U.S. Pat. No. 5,699,245 (1997) to Herold. These lightning detection apparatus determine range and bearing to storms using the frequency components emanating from lightning. These apparatuses suffer from a number of disadvantages:
1. The installation of these systems in aircraft requires locating the system away from low frequency (noises area) generators such as deicing equipment and 400 hertz power supply connections.
2. Calibrating these systems to minimize aircraft effects and noise sources.
3. The displaying of the rate of lightning activity over a predetermined time interval is not provided.

Consumers installing the apparatus on aircraft have problems finding a location on the aircraft with low aircraft noise at the lightning frequency chosen by the apparatus. There are a limited number of locations available to the consumer to install lightning hardware antennas. The ability to move the antenna to minimize aircraft noise is costly and most cases prohibited, For example, in the U.S. Pat. No. 3,715,660, (Ruhnke) based on the ratio of signals representing the magnetic and electric field associated with the discharge. The determination of the direction of the discharge is not made. In addition, U.S. Pat. No. 4,422,037 (Coleman) and companion patent (U.S. Pat. No. 4,672,305) discloses a storm mapping system which determines range based on the ratio of electromagnetic fields measured at two set frequencies and comparing the obtained values to strikes occurring in three ranges near field, mid field and far field. These apparatuses range accuracy increased by decreasing the measured lightning frequency. Unfortunately, the aircraft power systems also work at lower frequencies. The apparatus ability to detect lightning at ranges to 100 miles was compromised. The consumer objected to this reduced range setting. Further, an apparatus (U.S. Pat. No. 4,873,483 and companion U.S. Pat. No. 4,803,421 (Ostrander)) determines the range to the lightning strike based on the ratio of integrated electromagnetic signals. The electromagnetic fields are associated to signals received by a narrow band and a wide band filter. Each pulse is further classified by the pulse width of the lightning discharge to isolates the far field, mid field and near field signals. As with the prior inventions, this apparatus measured the lightning over a wide frequency range. Thus the same potential for detecting aircraft noise caused false targets to be displayed. No display of lightning rate is provided.

Inventors have created apparatuses to detect the aircraft noise and minimize displaying false targets. For example, the U.S. Pat. No. 5,295,072 (Stevens), and U.S. Pat. No. 5,303,152 incorporates a number of the features included in the previously discussed patents. As set forth, the range and bearing is determined by taking many samples of the lightning signals over a period of time to determine the frequency signature. A group of filters are used to determine the frequency signature. Range and bearing is determined by applying a set of weights to each filter output. Further, the pulse width is used to classify the lightning strikes into three types to set the weight values. Although these apparatuses incorporated software algorithms to eliminate aircraft noise and false targets, the consumers still complain of false targets and confusion on the lightning storm location. No display of lightning rate is provided.

U.S. Pat. No. 5,500,586 (Youngquist), and companion U.S. Pat. Nos. 5,504,421 and 5,500,602 (Youngquist) incorporate a number of the previously discussed features. The storm monitoring apparatus orients the magnetic fields at an angle of 45 degrees to the heading axis of an aircraft and determines to range and bearing by evaluating at a high rate the frequency or spectrum of the lightning signal. This apparatus does not address the noise aircraft installation problem.

U.S. Pat. No. 4,023,408 discloses a storm mapping system that detects electrical activity caused by weather phenomenon such as lightning strokes. The system is intended to operate on the far field (or radiation field) pattern generated by the lightning stroke. According to the disclosed, the far field pattern is characterized mainly by a low frequency spectrum with maximum amplitude signals occurring between seven and seventy three kilohertz (kHz). A trio of antenna sensors, an electric field antenna and two-crossed magnetic field antennas, are used and each is connected to a tuned receiver on a center frequency of fifty kHz. The crossed loop magnetic field antennas are used to locate the lightning signals in azimuth angle by comparing the relative magnitude of the signals induced in the cross loop sensors to the electric field antenna in a conventional manner. The magnetic field signals are time correlated with the electric field signals before integration. This provides some measure of avoiding unwanted noise like signals. Integration of the correlated signals is formed for 0.5 milliseconds but only after the vector sum of the magnetic field sensor signals is found to exceed a predetermined threshold value. The algebraic sum of the magnetic field sensor signals is amplified and then squared. This signal is used to divide the integrator output signals thereby reducing the magnitude of larger correlated integrated signals below the magnitude of smaller ones. These inverted signals then drive a display such as a CRT display to show larger signals closer to the observation point and smaller signals farther away.

This system has been used on aircraft and appears to work well, but it depends heavily on the magnitude of correlated electric and magnetic field signals to provide a measure of the range of the signal from the observation point of the equipment. Accordingly, the accuracy of range estimates may be affected by the variation in the severity of the thunderstorms. Also, some of the detailed characteristics of lightning stroke signals are not utilized to discriminate between interfering signals and true lightning electrical signals. The rate of lightning activity over a predetermined time is not provided.

U.S. Pat. No. 6,215,294 (Coleman) discloses an apparatus and method for displaying the lightning rate of activity and location from the observers. This system has been used on aircraft and appears to work well, but the installation of the systems and integration of the system can be improved.

Lightning Phenomenon Overview

The average lightning strike's duration is from 0.5 second up to 1 second. A lightning strike is made up of the following measurable components:
1. Preliminary Discharge
2. Dart Leaders
3. Stroke(s)

The Preliminary Discharge will last for typically 5 to 6 milliseconds. Then Dart Leaders will occur for 4 milliseconds, typically, until contacting the ground/etc. Dart Leaders last 100 microseconds each for 3 milliseconds and then 10 microseconds each for 1 millisecond for approximately 50 dart leaders total. Typically, 30 microseconds occur between the occurrence of the last Dart Leader and the Stroke. Ninety percent of the lightning strikes contain less than 8 strokes. The average lightning strike contains 3 to 4 strokes. Each stroke has a maximum duration of 1 millisecond. Typically, there are 40 to 80 milliseconds between strokes. The signal signature between a Preliminary Discharge, Dart Leaders, and Strokes are very distinct. For further detailed information, see "Airborne Warning Systems for Natural and Aircraft-Initiated Lightning", RTCA paper No. 306-82/AHTD-4 dated Nov. 8, 1982.

The objects and advantages of the present invention are:
1. A lightning detection system whose installation is convenient and not susceptible to aircraft low frequency noise;
2. A lightning detection system with increase range detection;
3. A lightning detection system with increase sensitivity to displaying the rate of lightning.
4. A lightning detection system with all hardware contained within antenna.

The objects, features and advantages of the present invention will become more fully apparent from the following detailed description of the preferred embodiment, the appended claims and the accompanying drawings in which:

FIG. 1 comprises a functional block diagram of the preferred embodiment of the storm detection apparatus of the present invention.

FIG. 7 shows the ARINC Transmitter and Receiver Word Formats

SUMMARY OF THE INVENTION

The present invention comprises an apparatus and method for displaying the location of regions of recently occurring lightning activity. This lightning activity is very carefully analyzed and formatted for visual display. The displayed information is intended as an aid in severe weather avoidance. The invention provides the following features:

Increased bearing and distance accuracy to storm.
ARINC 429 interface.
Heading stabilization of data.
Velocity stabilization of data.
Clear function
Integrated into single antenna package.

The invention has four basic modes of operation. The modes are defined as follows:
1. Normal lightning display mode.
2. Standby mode is selected when lightning data is to be collected but not displayed.
3. When very active storms are present or if questionable lightning data is displayed, the indicator and data accumulator buffers may be cleared by momentarily switching to Clear and back to normal mode.
4. The Test mode is invoked by leaving the mode switch in the test position for longer than 3 seconds.

The invention comprises a receiving means for separately receiving the electric (E), the wing magnetic (Hwing) and the nose magnetic (Hnose) field components of lightning signals over a range of frequencies outside the low aircraft noise frequencies. In the preferred embodiment, the receiving means includes a pair of cross-loop sensors and an electric field sensor. These sensors measure the time rate of change of the magnetic and electric flux densities. The outputs are suitably amplified and integrated to provide a measure of the E and H fields of the lightning signals.

In the preferred embodiment a processor performs the lightning detection signal processing, cell tracking algorithms, the I/O and display functions. This processor was selected in order to adapt the preferred embodiment to have all the hardware in the antenna. The processor with an independent analog to digital converts can sample the E and H fields while independently processing the lightning signal processing algorithm changes, the avionic interfaces, interface protocols, and display changes. In the preferred embodiment the size of the antenna was optimized for locating lightning from an aircraft.

DETAILED DESCRIPTION OF THE PREFERRED EMBODIMENT

Figure 1:
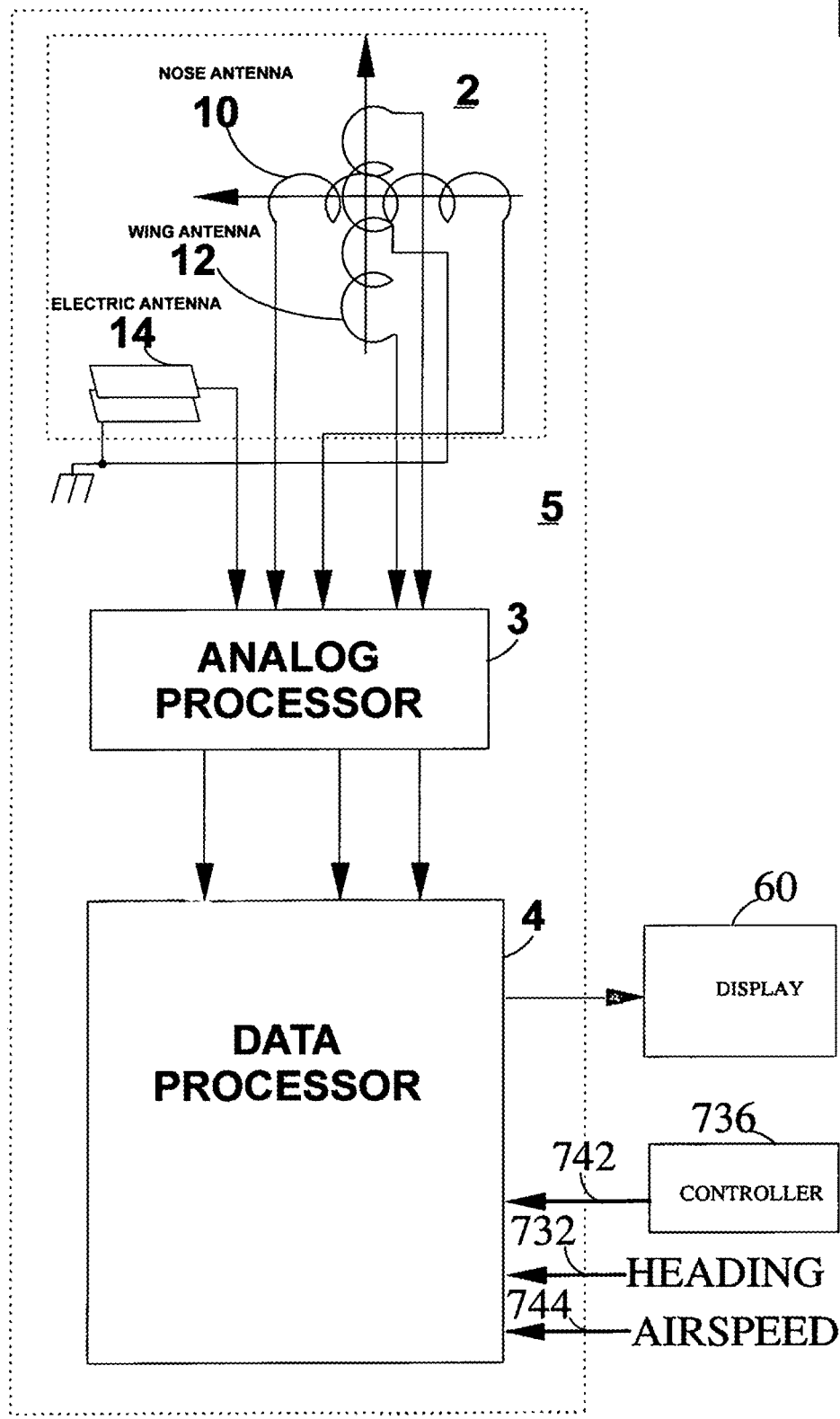
Figure 2:
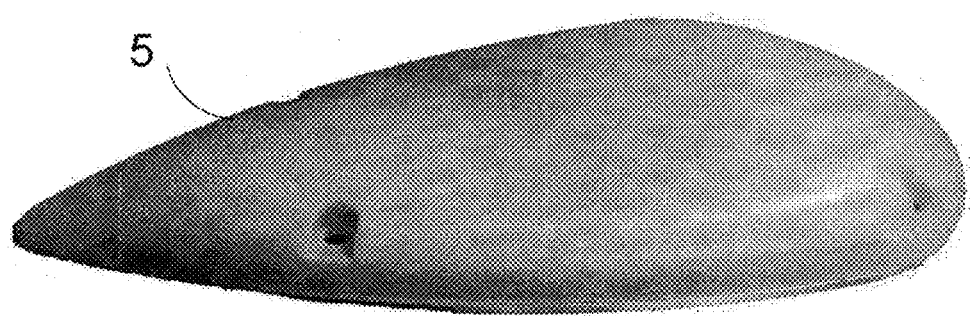
FIG. 2 shows the preferred embodiment of the apparatus enclosed within the antenna
Figure 2:
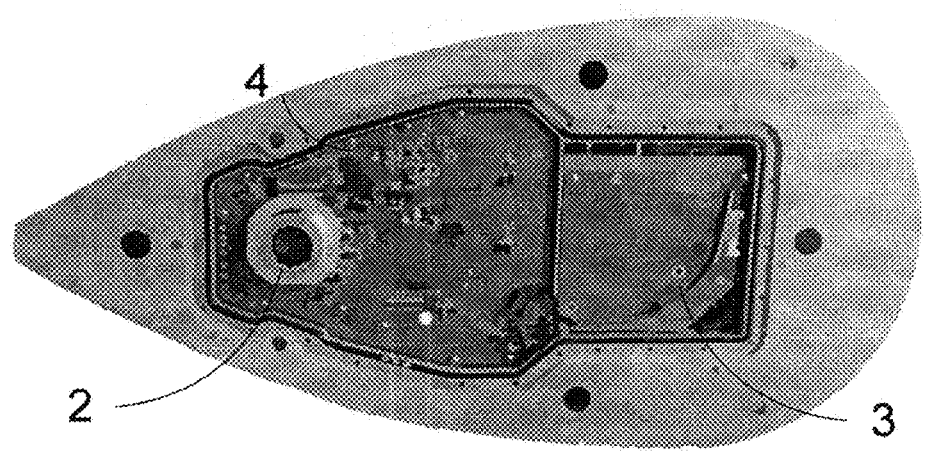
Figure 3:
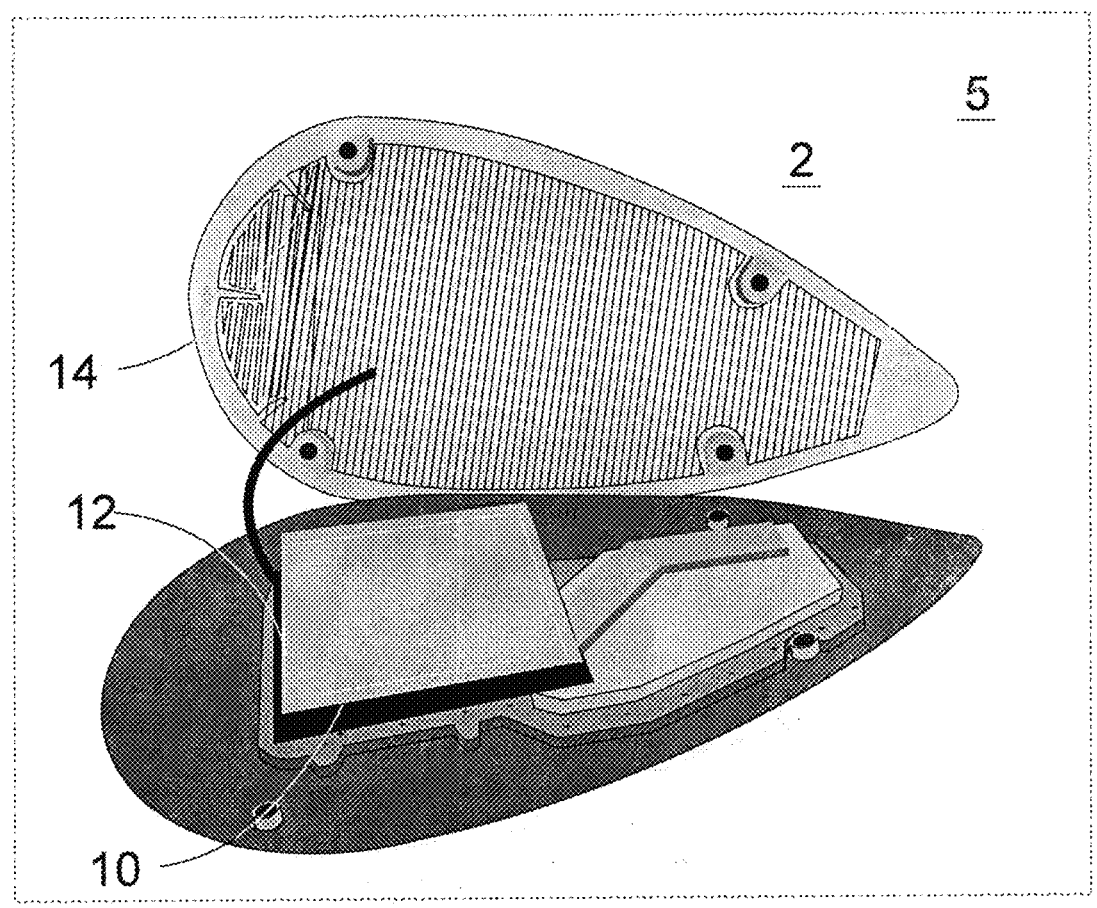
FIG. 3 shows the inside of the preferred embodiment of the apparatus of the present invention.

Description of FIGS. 1, 2 and 3

Referring now to FIG. 1 there is shown a block diagram of a preferred embodiment of the storm warning system of the present invention generally designated 5. As shown in FIG. 1, the invention 5 comprises an antenna 2, analog processor 3, a data processor 4, and an input/output 2 connector. Referring to FIG. 2, the preferred embodiment is contained within a small package. To locate all hardware in the antenna requires selecting a method that uses the least amount of space but allows the antenna to have the required space and volume to receive the lightning signals required for the aircraft application. The analog circuitry 3, data processor 4 and connector 2 is shown. Referring to FIG. 3, the antenna 2 is comprised of a pair of cross loop magnetic field antennas 10 and 12 and an electric field antenna 14. Since the cross loop magnetic field antenna elements have their axes perpendicular to one another, antenna 10 will be referred to as the nose magnetic field antenna (Hnose) while antenna 12 will be referred to as the wing magnetic field antenna (Hwing). The electric field antenna is located on the top inside of the radome with a preferred area and distance from the base of the antenna to work for aircraft application. The three antenna elements are responsive to the time rate of change of magnetic and electric flux densities occurring as a result of electrical activity associated with lightning strikes.

Figure 4:
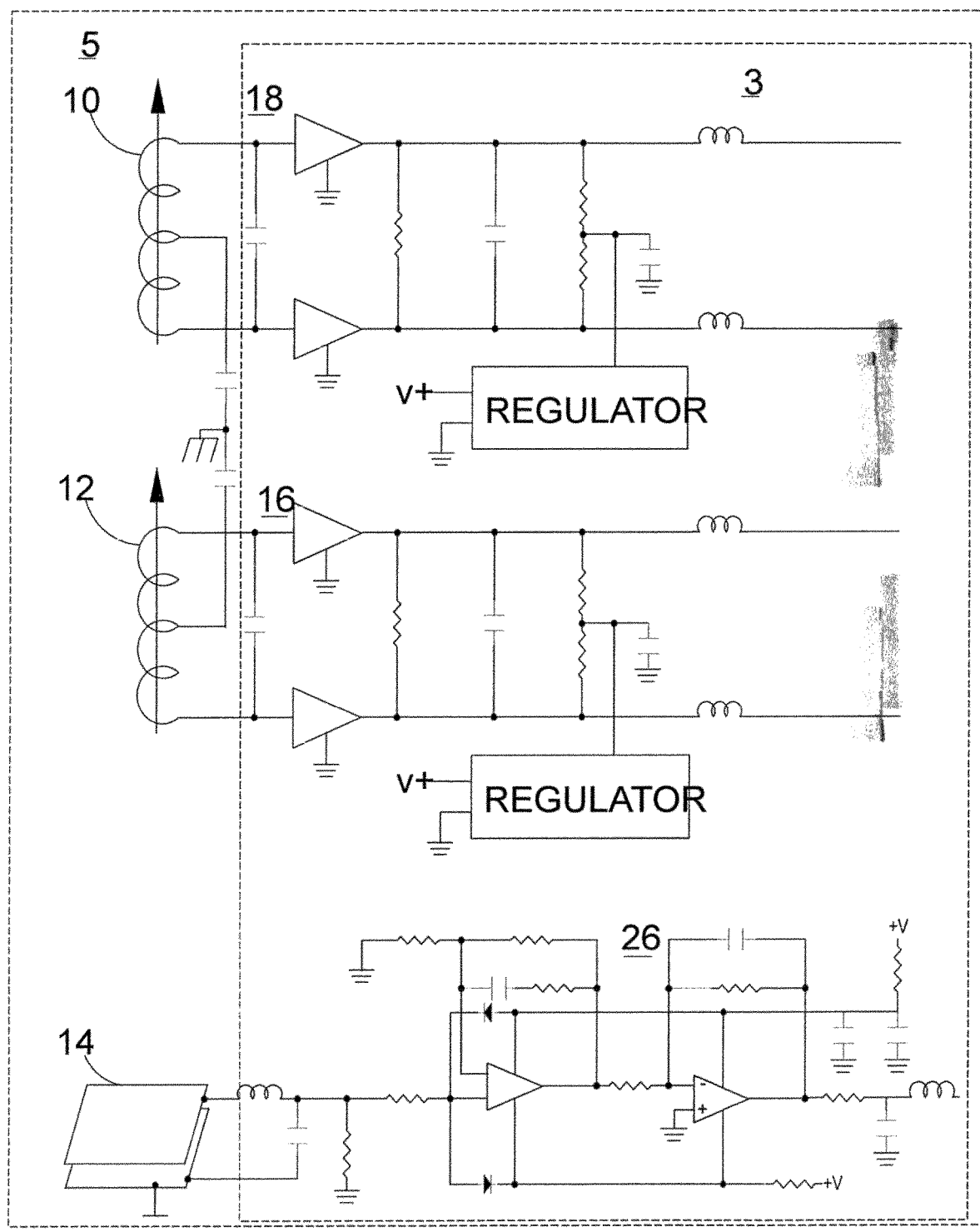
FIG. 4 shows the block diagram of the analog circuitry of preferred embodiment of the apparatus of the present invention.
Figure 5:
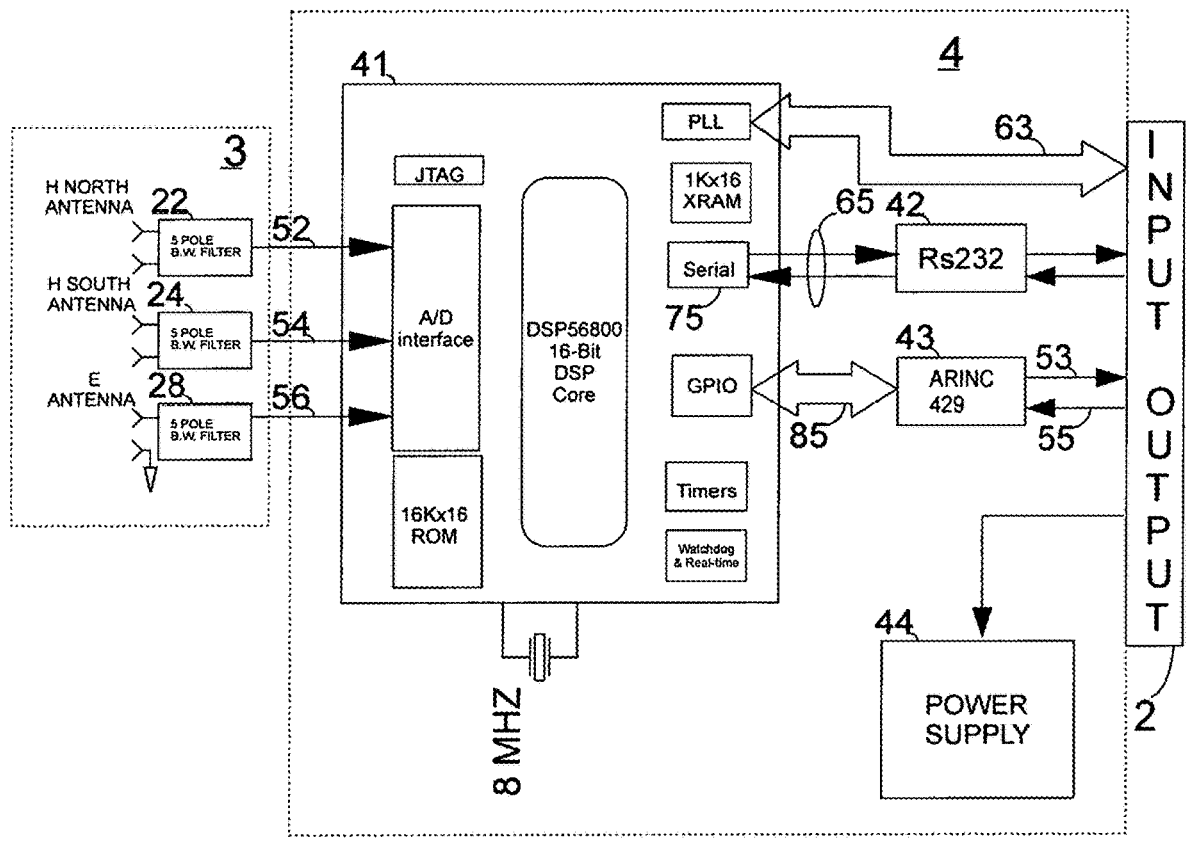
FIG. 5 is a block diagram of the analog and data processor circuitry of the apparatus of the present invention.

Description of FIGS. 4 to 5

Referring to FIG. 4, the signals received by the antenna elements are transmitted to wide band amplifiers, designated generally 16, 18 and 26. In the preferred embodiment, the antenna elements 10, 12, 14 and the wide band amplifiers (16, 18 and 26) operate over a frequency range of from approximately 10-kilohertz to approximately 3-megahertz. Amplifiers 16 and 18 are in the preferred embodiment manufactured by Motorola type LMH6644. The electric field integrator 26 is included within the analog circuitry 3 and is of the type LMH6644. The electric field signal 56 (FIG. 5) is proportional to the area of electric field antenna and to the distance from the top of the radome to the base. For the preferred embodiment the area is 66 square inches and the distance is 1 inch from base. Outputs of amplifiers 16 and 18 which provides a wing magnetic field component and a nose magnetic field component are provided to a five pole filter with a 3 DB bandwidth of 760 kilohertz designated as 22 and 24 respectively (FIG. 5). The vertical electric field component integrator 26 is also filter by a five pole filter with a 3 DB bandwidth of 760 kilohertz designated 28. The output of the five pole filters 22, 24 and 28 are provided in parallel to a processor 41 (FIG. 5).

The processor 41 is a multi-interface display and control processor. This processor interfaces to aircraft systems via connector input/output 2. The display output may be either 360-degree for lightning or 180/160/120/90-degree sector scans to accommodate a lightning display on an overlaid weather RADAR display. The processor 41 performs all of the interface conversions in order to achieve maximum availability to not only new aircraft but also to aircraft retrofits. The processor 41 requires longitude, latitude or velocity (FIG. 1) line 744 data in order to stabilize aircraft position with the cell position. In addition, ARINC 429 (FIG. 1) line 732 heading is used to rotate the cell data as the aircraft turns. An ARINC 429 Low Speed output (TX1) 53 is used to allow the processor 41 to interface to the aircraft display systems. An ARINC 429 High or Low Speed input (RX1) and ARINC 429 Low Speed input (RX2) 55 is provided for inertial navigation data. As shown in FIG. 5, the processor 41 utilizes an Motorola 56F807 processor with 4K×16 words Date RAM, 2K×16 words Date Flash, 60K×16 words of Program Flash, 2K×16 words of Program RAM, and 2K×16 words of Boot Flash. An advanced ARINC controller 43 utilizes a HOLT integrated circuits HI-8583PQI-10 and is attached to the DSP56F807 bus for the purpose of generating the ARINC output and looking for the required labels on the ARINC input bus.

Interrupt Structure

The Processor 41 has a built in interrupt controller that supports seven levels of interrupts. The Processor 41 provides priority to the interrupts associated with the highest level. A detail discuss of the interrupt controller is provided in the Motorola manuals. Table 1 lists the vector and address of each interrupt source used by Processor 41. All interrupts are set to level 1 and therefore are not nested. The SDK's vector.c file contains a default interrupt vector table. The Hardware Reset vector is programmed with the address of archstart( ) and all other vectors are programmed with the address of configUnhandleinterruptISR( ). The user can effectively modify the interrupt vector table in vector.c by adding # defines in appconfig.h, which are used to conditionally compile vector.c. This is described in more detail in the Motorola SDK manual section 7.2.2, Installing ISRs. The following SDK modules are included in the appconfig.h file.

```
#define INCLUDE_BSP              /* BSP support */
#define INCLUDE_IO               /* I/O support */
#define INCLUDE_TIMER            /* timer support */
#define INCLUDE_SCI              /* SCI support */
#define INCLUDE_ADC              /* ADC support */
#define INCLUDE_QUAD_TIMER /* Quadrature timer support */
#define INCLUDE_GPIO
#define INCLUDE_PWM
The watchdog timer is defined as:
#define INTERRUPT_VECTOR_ADDR_63  LowvoltageISR
#define INTERRUPT_VECTOR_ADDR_1         copTimeoutISR
#define COP_TIMEOUT                     800000L
#define PLL                             20.
#define INTERRUPT_VECTOR_ADDR_1         copTimeoutISR
#define COP_TIMEOUT                     800000L
#define PLL                             20.
``` hardware/software interface within Processor 41 consists of internal registers that control many of the timing and I/O ports used by the Processor. Due to the complexity of this interface, the Motorola DSP56F807FM/D Programming Manual must be consulted for full details. This section will only summarize the major interface setups to be used. Table 3 summarizes the internal register map of the DSP56F807. Pulse Width Modular Internal Register Map The ARINC 429 43 (FIG. 4) requires a 1 MHz clock that is provided by the pulse width module A within data processor '41. Table 4 lists the initialized values of each internal register described in more detail below Set in appconfig.h The setup of the 1 MHz clock is completed by inserting the following code:

```
pwm0FD = open(BSP_DEVICE_NAME_PWM_A, 0);
pwmIoctl ( pwm0FD, PWM_SET_DISABLE_MAPPING_REG1, PWM_ZERO_MASK,
BSP_DEVICE_NAME_PWM_A);
    pwmIoctl ( pwm0FD, PWM_SET_DISABLE_MAPPING_REG2,
PWM_ZERO_MASK, BSP_DEVICE_NAME_PWM_A);
    pwmIoctl ( pwm0FD, PWM_SET_INDEPENDENT_OPERATION,
PWM_ZERO_MASK, BSP_DEVICE_NAME_PWM_A);
    pwmIoctl ( pwm0FD, PWM_SET_ALIGNMENT, PWM_ALIGN_CENTER,
BSP_DEVICE_NAME_PWM_A);
    pwmIoctl ( pwm0FD, PWM_OUTPUT_PAD, PWM_ENABLE,
BSP_DEVICE_NAME_PWM_A);
BSP_DEVICE_NAME_PWM_A);
```

Hardware/Software Interface

The Processor 41 hardware/software interfaces can be summarized in the following functional areas:
1. DSP microprocessor
2. Pulse Width Modular
3. Calibration switches
4. Discrete inputs
5. RS232 test data port

TABLE 1

Processor 41 Interrupt Vectors and Addresses

| VECTOR | IRQ TABLE ADDRESS | SOURCE | DESCRIPTION |
|---|---|---|---|
| 1 | $0002 | Watchdog | Watchdog timer |
| 43 | $0056 | Timer A-1 | 1 second clock |
| 44 | $0058 | Timer A-2 | .001 second clock |
| 45 | $005A | Timer A-3 | .25 second Clock |
| 32 | $0040 | Timer C-2 | A/D converter |
| 31 | $0042 | Timer C-3 | A/D converter |
| 9 | $0012 | IRQB | ARINC 429 (HI) RX2 data |
| 8 | $0010 | IRQA | ARINC 429 (Lo) RX1 data |
| 53 | $006A | SCI #0 RCV FULL | RS232 RX data |
| 51 | $0066 | SCI #0 TX RDY | RS232 TX data |
| 52 | $0068 | SCI #0 RCV ERR | RS232 RX ERROR |
| 50 | $0064 | SCI #0 TX CMPLT | RS232 Buffer Empty |

4. Discrete inputs
5. RS232 test data port
6. Analog to Digital converter port
7. ARINC 429 RX1/RX2 Receiver ports
8. ARINC 429 TX1 transmitter port The interfaces to these functional blocks will be described individually. In order to provide an overview of the Processor, Table 2 and Table 3 give the overall memory map. The

TABLE 2

Processor 41 Memory Map

| ADDRESS | TYPE | DESCRIPTION | COMMENTS |
|---|---|---|---|
| 0x0004 0xEFFF | FLASH | Program Flash | 60K words |
| 0x2000 0x3FFF | FLASH | Data Flash | 8K words |
| 0xF800 0xFFFF | FLASH | Boot Flash | 2K words |
| 0x0000 0x0FFF | RAM | Data RAM | 4K words |
| $1000 | Peripheral | SYS_BASE | — |
| $1100 | Peripheral | TmrA_Base | TIMER A |
| $1200 | Peripheral | PWMA_Base | PWMA |
| $1280 | Peripheral | ADCA_Base | ADCA |
| $12C0 | Peripheral | ADCB_Base | ADCB |
| $1300 | Peripheral | SCI0_Base | SCI0 |
| $13C0 | Peripheral | GPIOB_Base | GPIOB |
| $13E0 | Peripheral | GPIOD_Base | GPIOD |
| $1330 | Peripheral | COP_Base | Watch Dog |

TABLE 3

Processor 41 Internal Register Map

| I/O ADDRESS | INTERNAL REGISTER DESCRIPTION |
|---|---|
| $1260 $127F | Interrupt Controller Registers |
| $1100 $1107 | Timer 0 Control Registers |
| $1108 $110F | Timer 1 Control Registers |
| $1110 $1117 | Timer 2 Control Registers |
| $4000 $4002 | ARINC 429 |
| $FFFB | Interrupt Priority Registers |
| $1280 | AID Registers |

TABLE 3-continued

Processor 41 Internal Register Map

| I/O ADDRESS | INTERNAL REGISTER DESCRIPTION |
|---|---|
| $12FF $1300 $131F | RS232 Registers |

```
pwmIoctl ( pwm0FD, PWM_SET_INDEPENDENT_OPERATION,
PWM_ZERO_MASK, BSP_DEVICE_NAME_PWM_A);
   pwmIoctl ( pwm0FD, PWM_SET_ALIGNMENT, PWM_ALIGN_CENTER,
BSP_DEVICE_NAME_PWM_A);
   pwmIoctl ( pwm0FD, PWM_OUTPUT_PAD, PWM_ENABLE,
BSP_DEVICE_NAME_PWM_A);
BSP_DEVICE_NAME_PWM_A);
```

The processor 41 timer services are automatically included into the project by inserting "# define INCLUDE_TIMER" in the appconfig.h file. This defines nine clocks to the project. The project uses CLOCK_AUX1, CLOCK_AUX2 and CLOCK_AUX3. These three Timers

TABLE 4

Initial Internal PWA Register Settings

| REGISTER | INITIALIZED VALUE | COMMENT |
|---|---|---|
| PWM_A_CONTROL_REG | 0x5001 | |
| PWM_A_FAULT_CONTROL_REG | 0 | |
| PWM_A_FAULT_STATUS_REG | 0 | |
| PWM_A_OUTPUT_CONTROL_REG | 0 | |
| PWM_A_COUNTER_MODULO_REG | 0x0014 | 1 MHz clock |
| PWM_A_DEAD_TIME_REG | 0 | |
| PWM_A_DISABLE_MAPPING_1_REG | 0xFFFF | |
| PWM_A_DISABLE_MAPPING_2_REG | 0x00FF | |
| PWM_A_CONFIG_REG | 0x8000 | |
| PWM_A_CHANNEL_CONTROL_REG | 0 | |
| PWM_EXCLUDE_PWM_B | 0034H* | NOT USED | are used by the Processor 41 and must also be setup to handle the hardware interfaces. CLOCK_AUX1 generates interrupt for Timer1ISR is defined with the following code:

```
timer_create(CLOCK_AUX1, &Timer1Event, &Timer1);
   Timer1Settings.it_interval.tv_sec = 0;
   Timer1Settings.it_interval.tv_nsec = 1000000000;
   Timer1Settings.it_value.tv_sec = 0;
   Timer1Settings.it_value.tv_nsec = 1000000000;
   timer_settime(Timer1, 0, &Timer1Settings, NULL);
```

CLOCK_AUX2 generates interrupt for Timer2ISR is defined with the following code:

```
timer_create(CLOCK_AUX2, &Timer2Event, &Timer2);
   Timer2Settings.it_interval.tv_sec = 0;
   Timer2Settings.it_interval.tv_nsec = 1000000000;
   Timer2Settings.it_value.tv_sec = 0;
   Timer2Settings.it_value.tv_nsec = 1000000000;
   timer_settime(Timer2, 0, &Timer2Settings, NULL);
```

CLOCK_AUX3 generates interrupt for Timer3ISR and is defined with the following code:

```
timer_create(CLOCK_AUX3, &Timer3Event, &Timer3);
   Timer3Settings.it_interval.tv_sec = 0;
   Timer3Settings.it_interval.tv_nsec = 250000000;
   Timer3Settings.it_value.tv_sec = 0;
   Timer3Settings.it_value.tv_nsec = 250000000;
   timer_settime(Timer3, 0, &Timer3Settings, NULL);
```

The Analog to Digital Converter within processor 41 is defined as a super fast interrupt by adding the following code in the appconfig.h file:

```
void ADC_RAW_ISR(void);
   #define INTERRUPT_VECTOR_ADDR_55ADC_RAW_ISR
```

The ADC_RAW_ISR module must save all registers and restore on exit.

The ARINC 429 43 (FIG. 5) uses IRQA and IRQB interrupts and require the following code in appconfig.h:

```
void ARINC_RX1_INTERRUPT(void);
void ARINC_RX2_INTERRUPT(void);
#define INTERRUPT_VECTOR_ADDR_8 ARINC_RX1_INTERRUPT
#define INTERRUPT_VECTOR_ADDR_9 ARINC_RX2_INTERRUPT
#define GPR_INT_PRIORITY_8 1
#define GPR_INT_PRIORITY_9 1
```

The ARINC 429 43 interrupts from IRQA and IRQB are level triggered. The interrupt register must be set by writing the following data to address 0xFFFB:

asm (move #$ff12,x:0xfffb); //set the Interrupt register

RAM Memory

The static RAM memory is located at 0x0000 to 0x0FFF and is intended to be the data RAM and stack for the Processor. The Preferred embodiment uses 3100 of the 4096 available.

Watchdog Timer

The watchdog timer is contained in processor 41 computer operating properly (COP) module. The COP is used to help software recover from runaway code. The COP is a free-running counter. Once enabled, it is designed to generate a reset on overflow. Software must periodically service the COP in order to clear the counter and prevent a reset. The Watchdog timer is reset periodically by using SDK command copReload( );

This will reset the necessary hardware in the COP module of the processor 41. The COP control register is initialized by the following code:

copInitialize(COP_ENABLE|COP_WRITE_PROTECT, 0x0FFF);

This starts the COP module, prevents in further writing to the control register and sets maximum timeout.

Analog to Digital Converter Port

The Processor 41 (DSP56F807) has two dual 4-inputs, 12 bit ADCs, named ADCA and ADCB, totaling 16 analog inputs. While the registers are named identically, they have different addresses. The ADC is initialized in the appconfig.h file by inserting the following:

/*ADC configuration*/

In addition the following code is inserted in the startup:

The A/D converter (within processor 41) full scale range is from 0 to +3 volts. The input voltage from the antenna are offset by 1.5 volts. The offset must be recorded so that it may be subtracted from all readings. Table 5 contains the scale factors for each signal. Use the following equation for computing the value of any signal read from the A/D converter.

Signal=–Scale_Factor (A/D_Date–A/D_Offset)

The ADC is started by writing to the control registers at 0x12c0 and 0x1280. The following is written to the control registers to start conversions:

```
move #14341,x:0x12c0;
move #14341,x:0x1280;
```

To stop ADC conversions, the following is written to the control registers:

```
move #22533,x:0x12c0;
move #22533,x:0x1280;
```

Calibration Switches

The Calibration switches are a read-only Bits from ports D and B. The Discrete inputs via bus 63 (FIG. 5) are a read-only Bit accessed with SDK command:

"ioctl(PortB, GPIO_READ, gpioPin(y, x))"

```
//* define the A/D
const adc_sState sadc0 = {
 /* AnalogChannel       = */ ADC_CHANNEL_0,
 /* SampleMask          = */ 0x1,
 /* OffsetRegister      = */ FRAC16(0.0),
 /* LowLimitRegister    = */ 0,
 /* HighLimitRegister   = */ 0,
 /* ZeroCrossing        = */ 0,
};
const adc_sState sadc4 = {
 /* AnalogChannel       = */ ADC_CHANNEL_4,
 /* SampleMask          = */ 0x10,
 /* OffsetRegister      =*/ FRAC16(0.0),
 /* LowLimitRegister    = */ 0,
 /* HighLimitRegister   = */ 0,
 /* ZeroCrossing        = */ 0,
};
const qt_sState quadParam = {
/* Configured for 2us ADC sample rate at 80MHz */
        /* Mode = */                    qtCount,
        /* InputSource = */             qtPrescalerDiv1,
        /* InputPolarity = */           qtNormal,
        /* SecondaryInputSource = */  0,
        /* CountFrequency = */          qtRepeatedly,
        /* CountLength = */             qtUntilCompare,
        /* CountDirection = */          qtDown,
        /* OutputMode = */              qtToggleOnCompare,
        /* OutputPolarity = */          qtNormal,
        /* OutputDisabled = */          0,
        /* Master = */                0,
        /* OutputOnMaster = */          0,
        /* CoChannelInitialize = */     0,
        /* AssertWhenForced = */         0,
        /* CaptureMode = */             qtDisabled,
        /* CompareValue1 = */           0,
        /* CallbackOnCompare = */           {0, 0},
        /* CallbackOnOverflow = */          {0, 0},
        /* CallbackOnInputEdge = */         {0, 0}
};      Adc0FD = adcOpen(BSP_DEVICE_NAME_ADC_0, 0, (adc_sState * )&sadc0 );
        Adc4FD = adcOpen(BSP_DEVICE_NAME_ADC_0, 0, (adc_sState * )&sadc4 );
        Adc8FD = adcOpen(BSP_DEVICE_NAME_ADC_1, 0, (adc_sState * )&sadc0 );
``` where x is the bit number of the discrete and y is the port D or B. The Bits are defined as ready only at ports B and D.

TABLE 5

A/D Mux Select Codes and Scale Factors

| MUX ADDRESS | SCALE_FACTOR | SIGNAL NAME |
|---|---|---|
| 0x12c9 | .76 mV/bit | Electric Field |
| 0x1289 | .76 mV/bit | HNS Field |
| 0x128D | .76 mV/bit | HEW Field |
| 3FD00H | 12.21 mV/bit | 5V Power Supply |
| 3FD02H | 33.67 mV/bit | 12V Power Supply |
| 3FD04H | 33.67 mV/bit | 12V Power Supply |

Calibration Switch on Port B

| 7 | 6 | 5 | 4 | 3 | 2 | 1 | 0 |
|---|---|---|---|---|---|---|---|
| Cs4 | SWA-2 (SPARE) | N/A | | SEE DISCRETE | | | |

Calibration Switch on Port D

| 5 | 4 | 3 | 2 | 1 | 0 |
|---|---|---|---|---|---|
| TEST LOOP | CS1 | CS2 | CS3 | N/A | /ARST |

CS1-CS4 are used to select the Magnetic Wing field correction (K4) in steps of 2 dB over a range of −16 to +14 dB. See Table 6 for the switch position values.

TABLE 6

Calibration Switch Settings

| SWITCH POSITION | CS1 | CS2 | CS3 | CS4 |
|---|---|---|---|---|
| 0 | 1 | 1 | 1 | 1 |
| +2 | 0 | 1 | 1 | 1 |
| +4 | 1 | 0 | 1 | 1 |
| +6 | 0 | 0 | 1 | 1 |
| +8 | 1 | 1 | 0 | 1 |
| +10 | 0 | 1 | 0 | 1 |
| +12 | 1 | 0 | 0 | 1 |
| +14 | 0 | 0 | 0 | 1 |
| −2 | 1 | 1 | 1 | 0 |
| −4 | 0 | 1 | 1 | 0 |
| −6 | 1 | 0 | 1 | 0 |
| −8 | 0 | 0 | 1 | 0 |
| −10 | 1 | 1 | 0 | 0 |
| −12 | 0 | 1 | 0 | 0 |
| −14 | 1 | 0 | 0 | 0 |
| −16 | 0 | 0 | 0 | 0 |

ARINC 429 Vs ARINC 561 Navigation

The ARINC 429 navigation format or the ARINC 561 (419) format is received on the same ARINC receiver RX-1 or RX-2 line 55 (FIG. 5). RX-1 is accessed by reading from 0x4000 and 0x4001. RX-2 is accessed by reading from 0x4002 and 0x4003. The ARINC 561 (419) format is BCD data, whereas ARINC 429 format is binary data. The processor 41 looks for the ARINC 429 and if not found looks for ARINC 561.

| Discrete Input Word From Port B | | | | | | |
|---|---|---|---|---|---|---|
| 7 | 5 | 4 | 3 | 2 | 1 | 0 |
| INH | | WOW | | | Controller | |

Discrete Inputs

The Discrete inputs line 63 (FIG. 5) are a read-only Bit accessed with SDK command:

"ioctl(PortB, GPIO_READ, gpioPin(B, x))"

where x is the bit number of the discrete.

The discrete must be read once every 250 milliseconds to obtain control and status information. The discrete comes from such sources as the controller 736 (FIG. 1), communication microphone, and landing gear.

Communication Microphone Transmit Inhibit Discrete Input

The XMIT INH* input discrete (Bit 4) is used to force a hardware lockout of lightning data from the antenna. A logic1 resumes normal operation. The Discrete input is a read-only Bit accessed with SDK command:

"ioctl(PortB, GPIO_READ, gpioPin(B, 4))"

Weight on Wheels (WOW*) Discrete Input

The WOW discrete (Bit 3) is a logic 0 when the aircraft is on the ground. This discrete is used by software in the "fixed TAS" modes in order to set TAS to 0 knots when the aircraft is on the ground. When the aircraft is off the ground, then the TAS that has been fixed shall be used in the aircraft position updates. The Discrete input is a read-only Bit accessed with SDK command:

"ioctl(PortB, GPIO_READ, gpioPin(B, 3))"

Controller Discrete Inputs

The 3 bits of controller 736 (FIG. 1) discrete inputs determine the operational mode of the processor 41. The controller 736 is designed such that only one signal is active at a time. Table 7 gives the possible combinations of modes and their description. The Discrete input is a read-only Bit accessed with SDK command:

"LX=ioctl(PortB, GPIO_READ, gpioPin(B, 1) )"
"STBY=ioctl(PortB, GPIO_READ, gpioPin(B, 0) )"

TABLE 7

Controller 736 Modes

| MODES | DESCRIPTION |
|---|---|
| 1 1 0 | Lightning Display Mode |
| 1 0 1 | Lightning Standby Mode |
| 0 1 1 | Lightning Clr/Tst |
| | Clear, if enabled for greater than 3 seconds go to Test mode |

Rs232 Test Data Port

The processor 41 module Serial Communication Interface (SCI) allows full-duplex, synchronous, serial communication with the peripheral MAX3227 RS232 module 42 via lines 65 (FIG. 5). The SCI is interrupt driven. There are two interfaces (SCI0 and SCI1). SCI0 is the only one used. The SCI interfaces are implemented by including in appconfig.h file:

define INCLUDE_SCI /*SCI support*/

The following code is inserted in the startup routine:

```
SciConfig.SciCntl = SCI_CNTL_WORD_8BIT |
SCI_CNTL_PARITY_NONE;
  SciConfig.SciHiBit = SCI_HIBIT_0;
  SciConfig.BaudRate = SCI_BAUD_19200;
  SciFD = open(BSP_DEVICE_NAME_SCI_0, O_RDWR | O_NONBLOCK,
&(SciConfig)); /* open device in Blocking mode */
  if ( SciFD == −1 )
  {
      assert(!" Open /sci0 device failed.");
  }
      ioctl(SciFD, SCI_DEVICE_OFF, NULL);
    ioctl( SciFD, SCI_DATAFORMAT_RAW, NULL);
      ioctl(SciFD, SCI_CALLBACK_RX,sciRxCallBack);
      ioctl(SciFD, SCI_CALLBACK_TX,sciTxCallBack);
      SciReadLength = 1;
```

ARINC 429 RX1/RX2 Receiver Ports

The ARINC 429 receiver ports 85 are accessible at 0x4000 and 0x4001 for RX1 and 0x4002 and 0x4003 for RX2. The external bus 85 of processor 41 must be slowed down by writing the following:

move #204,x:0xfff9; //set bus control register wait states

The receivers are both functionally identically. An interrupt is generated when the first label byte of the ARINC 429 4-byte word is received that matches the labels set in the ARINC 429 43 (HI-8582) control register. FIG. 7 shows the ARINC 4-byte word as read from the RX1/RX2 receivers. ARINC 429 Label Byte and Data byte 1 is read at address 0x4000 for RX1 and 0x4002 for RX2. Data byte 2 and byte 3 are read at 0x4001 for RX1 and 0x4003 for Rx2. The actual data fields definitions are dependent on the ARINC label. RX1 and RX2 is intended for receiving either 429 or 561 (419) navigation data. RX1 and RX2 are setup by writing to control using the following code:

Move #41020, x:0x4002;

Each receiver is loaded with the following labels:

```
move    #41022,x:0x4002    //take load label bit high
move    #$0010,x:0x4000    //set label 10 LAT in rcv 1
move    #$0090,x:0x4000    //set label 11 LONG in rcv 1
move    #$0093,x:0x4000    //set label 311 LONG in rcv 1
move    #$0013,x:0x4000    //set label 310 LAT in rcv 1
move    #$0024,x:0x4000    //set label 44 in rcv 1
move    #$0010,x:0x4001    //set label 10 LAT in rcv 2
move    #$0090,x:0x4001    //set label 11 LONGin rcv 2
move    #$0093,x:0x4001    //set label 311 LONG in rcv 1
move    #$0013,x:0x4001    //set label 310 LAT in rcv 1
move       #$0024,x:0x4001    //set label 44 in rcv 2
move       #41020,x:0x4002       //enable label recognition and start
```

ARINC 429 TX1 Transmitter Port

The ARINC 429 transmitter line 53 is accessed by writing to 0x4000 low order bytes and 0x4001 upper bytes. The transmitter starts transmitting and continues until the 32-word buffer is empty. The processor 41 software sends 32 ARINC words to the port at a time. The TX1 port is configured for Low speed ARINC 429 operation. FIG. 7 shows the two words that make up the ARINC 429 word (b1 thru b32). P is the required odd parity bit (b32) for ARINC 429 words. The parity bit is hardware generated. The ARINC data fields are dependent on the label being transmitted.

General Description of Preferred Embodiment Software

The processor 41 software performs the avionic I/O interface functions, control of the processor 41, and the display formatting of the lightning cell data. Tracking and stabilization of lightning cells is accomplished through a variety of navigation interfaces that are handled in the Processor 41. As shown in Table 8 and Table 9, the Processor 41 has a diverse set of inputs and outputs. The ARINC 429 43 (FIG. 5) is very common in the modern business and commercial aircraft. This serial interface provides a standardized means of communicating with many digital avionics systems and subsystems. An RS-232 42 serial interface is also provided for sophisticated field test command, control, and interrogation of the Processor 41. The Processor 41 handles the following inputs and outputs as a result of the numerous configurations of avionic environments. The software determines the environment and initializes the running configuration of the Processor 41 accordingly. The Processor 41 software has five process states that it supports. These states are summarized below. The software has been partitioned such that these states are controlled by internal flags rather than by explicit software modules. This is due to the fact that each state uses many of the same software modules but performs only a slightly different function (or in some cases, the same function) regardless of the state. For this reason, these states are discussed here at the component level since they will not be apparent at the module level.

1. Power Up State: Tests and initializes display processor. Determines Processor 41 status via discrete inputs. Goes to STANDBY state when hardware is ready, otherwise stays in power up.

2. Built-in Test (BITE) State: Commands Processor 41 to TEST, sends TEST mode annunciation and begins BITE. Annunciates faults or passes. Stays in BITE until commanded to another state.

3. Standby State: Commands Processor 41 to standby, sends STANDBY mode annunciation and waits until commanded to another state.

4. LX State: Receives and computes heading/position data for Processor 41. Formats and displays Cell data on displays per control data commands. Monitors configuration controls and performs integrity checks. Reports any detected failures. Remains in mode until commanded to go into another mode.

5. Clear State: Momentary actuation of the CLR/TST function shall clear the display and the data buffers. Momentary is defined as less than 3 seconds. Once the CLR/TST has been released, the processor 41 resumes the LX state and begins to accumulate new lightning cell data.

TABLE 8

| Processor 41 Inputs | |
| --- | --- |
| Digital Navigation Data: | ARINC 429 Longitude (Binary Format) |
| | ARINC 429 Latitude (Binary Format) |
| | ARINC 429 True Airspeed (BCD Format) |
| | ARINC 561/419 Longitude (BCD Format) |
| | ARINC 561/419 Latitude (BCD Format) |
| Discrete Data: | Calibration Switches |
| | Discrete Inputs |
| Test RS-232 | |

TABLE 9

| Processor 41 Outputs | |
| --- | --- |
| ARINC 429 DISPLAY Data | Mode |
| | Gain |
| | Calibration Data |
| | Heading |
| | Delta X/Y |
| | Position |
| Test RS-232 | |

TABLE 7-3

| I/O Processor Software Timing Allocations | | | | |
| --- | --- | --- | --- | --- |
| INTERRUPT | PERIOD | MODULE NAME | TIMING MAXIM | TIMING ACHIEVED |
| A to D interrupt | 1.4 us | ATOD_INTERRUPT | 133 ms | 600 us |
| ARINC RX1 | 666 us | ARINC_RX1_INTERRUPT | 666 us | 150 us |
| ARINC RX2 Low | 101 ms | ARINC_RX2_INTERRUPT | 101 ms | 4 ms |
| ARINC RX2 High | 12 ms | | 12 ms | 4 ms |
| RS-232 RX | 1 ms | RS232_RX_INTERRUPT | 1 ms | 100 us |
| RS-232 TX | 1 ms | RS232_TX_INTERRUPT | 1 ms | 100 us |
| DISPLAY Timer | 255 ms | DISPLAY_MESSAGE_TIMER | 320 us | 250 us |
| ARINC TX1 | 255 ms | ARINC_TX1_INTERRUPT | 200 us | 200 us |
| Low | 9 ms | | 200 us | 200 us |
| Local Reset | N/A | LOCAL_RESET_INERRUPT | 5 sec | 1 sec |

Over View of Component Software

The Processor 41 software performs the lightning data collection, algorithm processing, cell stabilization in regards to aircraft movement, and formatting of the lightning cell data to the ARINC bus 85 (FIG. 5). As shown in Table 10 and Table 11, the Processor 41 has very few inputs and outputs. Digital data from the Antenna is inputted via the ADCA and ADCB.

TABLE 10

| Processor 41 Inputs | |
| --- | --- |
| Antenna and Analog data: | E-Field High Frequency |
| | H-Field Nose High Frequency |
| | H-Field Wing High Frequency |
| | Heading |
| | Delta X/Y Position |
| | Calibration Data |
| Discrete Data: | Mode Register |
| | Power Configuration |

TABLE 11

| Processor 41 Outputs | |
| --- | --- |
| Antenna and Analog Data: ARINC Data: | Control Strobes |
| | Test Data |
| | Status |
| | Fault Code |
| | Cell Data |
| | Nay Data |
| | Calibration Data |
| Discrete Data: | Mode Register |

The software to determine the LDSP environment from the mode register and initializes the running configuration of the Processor accordingly. processing, cell stabilization in regards to aircraft movement, and formatting of the lightning cell data to the ARINC bus 85 (FIG. 5). The Processor 41 software has five process states that it supports. These states are summarized below. The software has been partitioned such that Built-in Test, Clear state, and calibration states are controlled by internal flags rather than explicit software modules. This is due to the fact that these states span many of the other modules and interrupts.

1. Power-up State: Tests and initializes the Data Processor. Performs the Cold or Warm process and goes to the Background Processor Test State.
2. Built-In Test (BITE) State: Full functional test from the antenna to the I/O Processor is performed. Annunciates faults or passes to the I/O Processor.
3. Normal Operation State: Lightning data is collected and processed. Movement is handled also.
4. Clear State: This process causes the entire collection of data to be zeroed and to start collecting of lightning data to begin again.
5. Calibration State: Automatic calibration of the electronics is performed.

Functional Description of Component Software

Figure 8:
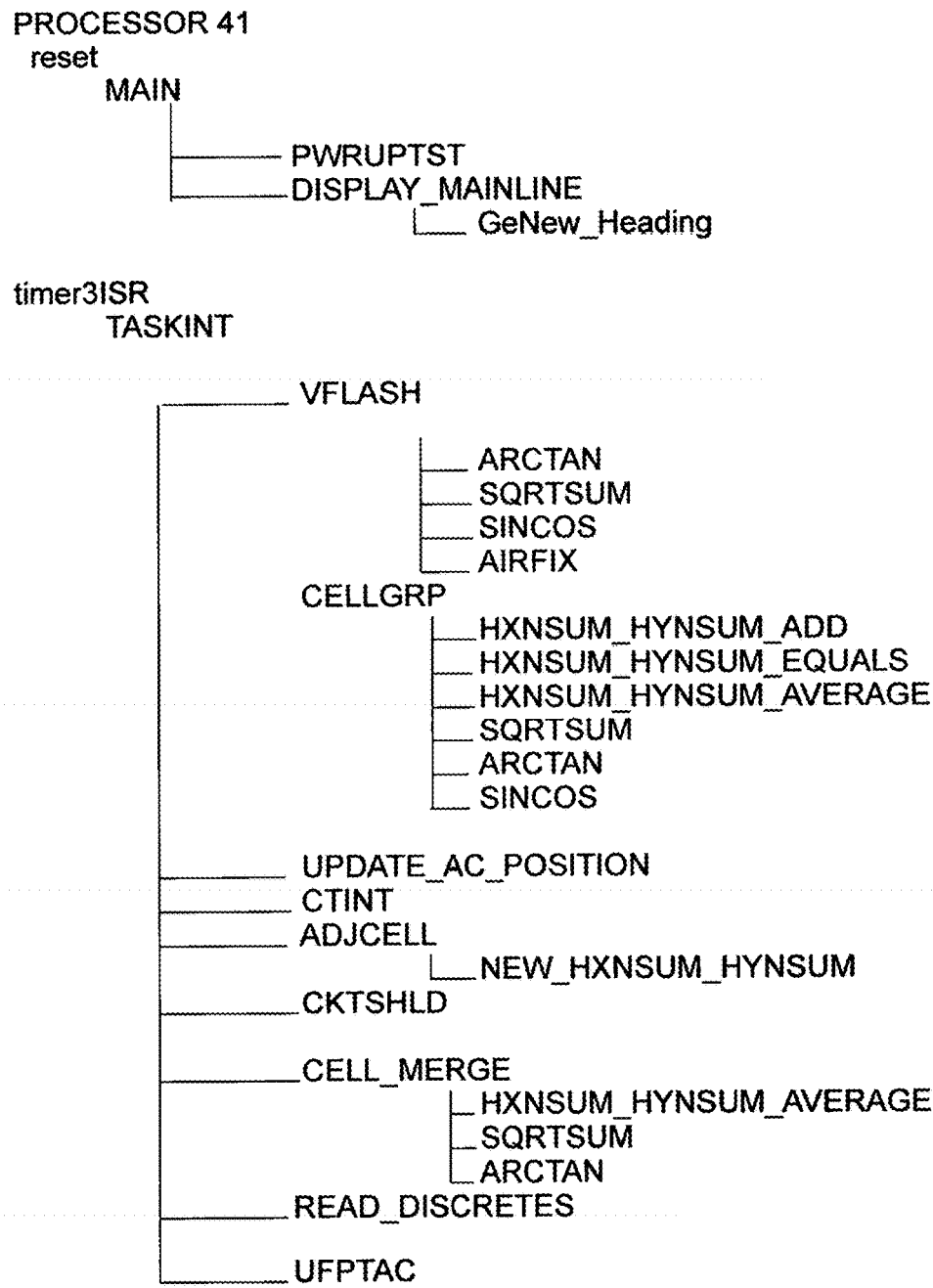
FIG. 8 is a Software Hierarchy Tree of the processor 41 portion of the apparatus of the present invention.
Figure 9:
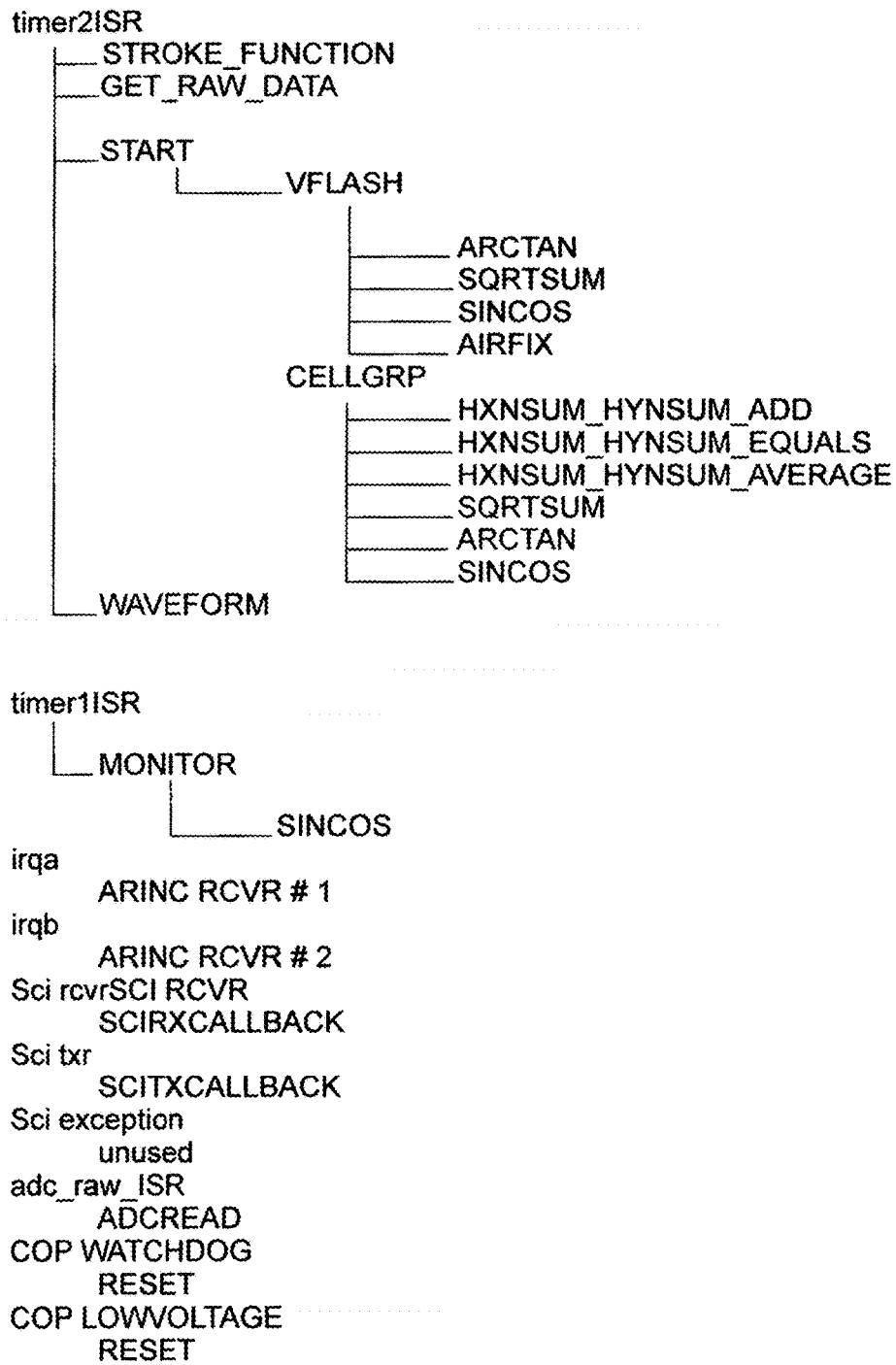
FIG. 9 is a continuation of the Software Hierarchy Tree of the processor 41 portion of the apparatus of the present invention.

The Motorola Embedded Software Development Kit (SDK) is the development environment for the Processor 41. It provides a software infrastructure that allows development of efficient, ready-to-use high level software application that are fully portable and reusable, not only across all DSP568xx family processors, but any future SDK-supported architectures as well. The SDK is used with the CodeWarrior for Motorola DSP56800 development tools. These development tools include an Integrated Development Environment (IDE) for assembling source code files, resource files, library files, and other files. For general information about the CodeWarrior IDE, refer to the IDE User Guide. The Processor 41 uses C++ high level language of the SDK tools for the initializing and functions that are not time critical. To minimize the processor time, the code use assembly language. The SDK tools allows the mixing of the C++ and assemble code within a module. The Processor 41 software program, due to the asynchronous occurrences of lightning, will be interrupt driven. Table 1 shows the priority of interrupts with the type and rate of interrupt. FIG. 8 and FIG. 9 shows the programs called by each interrupt for processing of its function. First a description of the interrupts and then a discussion of the program functions. Before proceeding, a brief overview of the phenomenon of lightning will be discussed.

Lightning Phenomenon Overview

Figure 6:
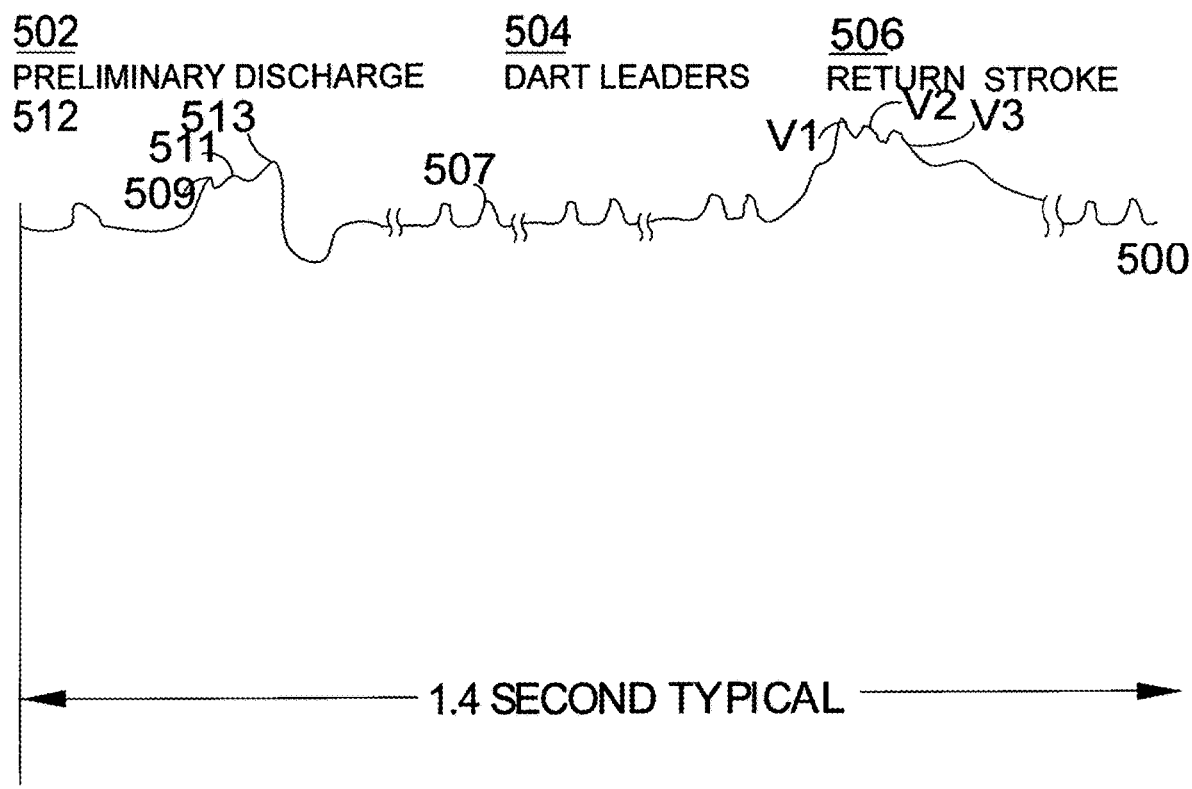
FIG. 6 depicts the signals of a lightning stroke in relation to a timing diagram for the apparatus of the present invention.

Referring to FIG. 6, the average lightning strike's duration is from 0.5 second up to 1 second. A lightning strike is made up of the following measurable components:

1. Preliminary Discharge (502)
2. Dart Leaders (504)
3. Stroke(s) (506)

The Preliminary Discharge will last for typically 5 to 6 milliseconds. Then Dart Leaders (507) will occur for 4 milliseconds, typically, until contacting the ground/etc. Dart Leaders last 100 microseconds each for 3 milliseconds and then 10 microseconds each for 1 millisecond for approximately 50 dart leaders total. Typically, 30 microseconds occurs between the occurrence of the last Dart Leader and the Stroke. Ninety percent of the lightning strikes contain less than 8 strokes. The average lightning strike contains 3 to 4 strokes. Each stroke has a maximum duration of 1 millisecond. Typically, there are 40 to 80 milliseconds between strokes. The signal signature between a Preliminary Discharge, Dart Leaders, and Strokes are very distinct. For further detailed information, see "Airborne Warning Systems for Natural and Aircraft-Initiated Lightning", RTCA paper No. 306-82/AHTD-4 dated Nov. 8, 1982.

Interrupt Description

Because of the nature of lightning FIG. 6, the preferred embodiment uses a interrupt driven process. this allows the lightning signals to be detected and processed by one processor 41. There are eleven interrupts service modules installed which interrupt the main module. FIG. 8 and FIG. 9 shows modules called by each interrupt. Each interrupt is completed before another interrupt can occur:

1. Timer1ISR
2. Timer2ISR
3. Timer3ISR
4. ARINC_RX1_INTERRUPT
5. ARINC_RX2_INTERRUPT
6. sciRxCallBack
7. sciTxCallBack
8. sciExceptionCallBack
9. ADC_RAW_ISR
10. copTimeoutISR
11. LowvoltageISR Description of LDSP Software Timing Allocations The Processor 41 is interrupt driven. This requires that each interrupt completes its task before another interrupt occurs. No other interrupt is allowed to interrupt any other interrupt routine. The STROKE_FUNCTION module is processed every 1 millisecond and requires approximately 120 microseconds to complete. The TASKINT module processes the stroke data and updates the cell data as the aircraft position changes. TASKINT interrupts every 250 millisecond. This module requires a maximum of 50 milliseconds. The MONITOR module is used to output to the RS232 bus the cell data and DSP status. The overall pipeline delay of lightning data to output to the ARINC 429 bus has a goal of 2.8 seconds. Table 7-6 summarizes the software timing budgets for the Processor.

Description of LDSP Software Timing Allocations

The Processor 41 is interrupt driven. This requires that each interrupt completes its task before another interrupt occurs. No other interrupt is allowed to interrupt any other interrupt routine. The STROKE_FUNCTION module is processed every 1 millisecond and requires approximately 120 microseconds to complete. The TASKINT module processes the stroke data and updates the cell data as the aircraft position changes. TASKINT interrupts every 250 millisecond. This module requires a maximum of 50 milliseconds. The MONITOR module is used to output to the RS232 bus the cell data and DSP status. The overall pipeline delay of lightning data to output to the ARINC 429 bus has a goal of 2.8 seconds. Table 7-6 summarizes the software timing budgets for the Processor. other interrupt routine. The STROKE_FUNCTION module is processed every 1 millisecond and requires approximately 120 microseconds to complete. The TASKINT module processes the stroke data and updates the cell data as the aircraft position changes.

TASKINT interrupts every 250 millisecond. This module requires a maximum of 50 milliseconds. The MONITOR module is used to output to the RS232 bus the cell data and DSP status. The overall pipeline delay of lightning data to output to the ARINC 429 bus has a goal of 2.8 seconds. Table 7-6 summarizes the software timing budgets for the Processor.

Processor 41 Software Hierarchy

The hierarchy tree diagram is shown in FIG. 8 and FIG. 9. Interrupts are denoted by lowercase words leading into a tree node

Description of Processor 41 Software Memory Allocations

Table 13 summarizes the software memory budgets for the Data Processor modules.

Stroke Processing Descriptions

ARINC Receiver 1 (ARINC_RX1_INTERRUPT) Function

The ARINC Receiver 1 (ARNICRCV1) gets the navigational inputs from the ARINC 429 module 43. These navigational inputs are used to stabilize the cell data due to movement. Also, the Processor 41 Modes are used by this routine to determine the configuration of the system. Upon a Clear occurring, the system will clear all the data from the ARINC 429 module. The ARINC_RX1_INTERRUPT module is located in the main.c file.

ARINC Receiver 2 (ARINC_RX2_INTERRUPT) Function

The ARINC Receiver 2 (ARNICRCV2) gets the navigational inputs from the ARINC 429 module 43. These navigational inputs are used to stabilize the cell data due to movement. Also, the Processor 41 Modes are used by this routine to determine the configuration of the system. Upon a Clear occurring, the system will clear all the data from the ARINC 429 module 43. The ARINC_RX2_INTERRUPT module is located in the main.c file.

TABLE 12

Processor 41 Software Timing Allocations

| INTERRUPT | INTERRUPT PERIOD | MODULE NAME | TIMING MAXIMUM | TIMING ACHIEVED |
| --- | --- | --- | --- | --- |
| Timer1ISR | 1 s | MONITOR | 500 ms | 120 s |
| Timer2ISR | .25 s | TASKINT | 225 ms | 20 ms |
| Timer3ISR | 1 ms | STROKE_FUNTCTION | 1 ms | 120 us |
| ARINC_RX1_INTERRUPT | 120 ms | ARINC_RX1_INTERRUPT | | 1.2 us |
| ARINC_RX2_INTERRUPT | 120 ms | ARINC_RX2_INTERRUPT | | 1.2 us |
| sciRxCallBack | 1 s | SciRxCallBack | | 52 us |
| sciTxCallBack | 1 s | SciTxCallBack | | 1.5 ms |
| ADC_RAW_ISR | 1.8 us | ADC_RAW_ISR | 1.8 us | 1.6 us |

TABLE 13

Processor 41 Software Memory Allocations

| MODULE NAME | DATA RAM SIZE | CODE FLASH SIZE |
| --- | --- | --- |
| ADJCELL | 0 | 416 |
| Startup | 0 | 1220 |
| VFLDVR | 0 | 258 |
| Waveform | 0 | 444 |
| HXNSUM_HYNSUM_EQUAL | 0 | 48 |
| HXNSUM_HYNSUM_ADD | 0 | 102 |
| NEW_HXNSUM_HYNSUM | 0 | 86 |
| HXNSUM_HYNSUM_AVERAGE | 0 | 202 |
| CELLGRP | 3 | 717 |
| CELL_MER | 0 | 327 |
| CKTSHLD | 0 | 429 |
| CTINT | 0 | 102 |
| Main | 1732 | 2026 |
| Get_Raw_Data | 0 | 1090 |
| UPDATE_A | 0 | 462 |
| Sincos | 0 | 2236 |
| ARCTAN | 0 | 2208 |
| UFPTAC | 0 | 462 |
| Heading | 0 | 262 |
| SQRTSUM | 0 | 184 |
| Sample | 1239 | 168 |
| MONITOR | 0 | 369 |

This memory allocation utilizes 73 percent of the RAM and 23 percent of the FLASH memory for the LDSP.

Stroke_Function (Timer2ISR)

The Processor 41 monitors the Electric field intensity detected by the antenna via the interrupt routine timer2ISR. The STROKE_FUNCTION module first calls Get_Raw_Data. For the preferred embodiment, when a preset threshold and signal rise time occur for the Electric Field signal, the module Get_Raw_Data determines if the data contained in the raw lightning data buffer are valid lightning strokes, static discharges, dart leaders, or radio signal interference. See FIG. 6 for definitions. For the preferred embodiment, this determination relies on certain criteria that relates to lightning return stroke statistical data, such as pulse rise time, magnetic to electric field ration, and minimum amplitude of the magnetic to electric field ratio, and minimum amplitude of the magnetic. The electric. field and 2 orthogonal Magnetic fields are stored in the processor memory raw buffer. If the Get_Raw_Data modules determines a valid stroke is in the raw buffer, the WAVEFORM module processes the stroke data to further identify a valid lightning stroke and determine range. The shape of the pulse is measured against a standard waveform (FIG. 6). The standard deviation from this standard wave shape determines if there is a lightning stroke. WAVEFORM processes the stroke data to a stroke buffer. This stroke data is collected into the processors memory for a 1.4 second time period triggered by the first valid stroke conversion. The Timer2ISR module is located in the main.c file.

Task Interrupt (Timer3ISR) Function

The TASKINT module waits for 1.4 second for the preferred embodiment after the first stroke to allow for all stroke data to be received from the lightning flash. The raw lightning data buffer is always collected in relationship to the aircraft's present position. TASKINT sets a flag after 1.4 seconds and calls VFLASH. Upon passing all the before mentioned checks the module VFLASH computes the direction and approximate distance to each lightning stroke. VFLASH may determine that a stroke has occurred but that not enough resolution was available to determine range. When this occurs the data is called an intercloud stroke and sent to CELLGRP for partial processing. See CELLGRP for a further explanation of this phenomena. The TASKINT interrupt starts the processing of the lightning flash data and handles the coordination of filling and processing the raw data buffer. The final step is to compute the vector magnitude and the angle in relation to a Fixed Reference System (fixed point system). Also an ambient noise level can be obtained and displayed for maintenance purposes only.

This interrupt occurs every 250 milliseconds (0.25 sec). Every 500 millisecond the modules UPDATE_AC_POSUITION, CTINT, Adjcell, and CELL_MERGE are executed. These modules update the cell buffer to the present aircraft position. The UFPTAC (update cell buffer to present aircraft position) module takes the distance traveled in the X and Y directions in the fixed reference system to update the cell buffer which was referenced to the old (previous) aircraft position to the new aircraft position. Upon new strike data being present the module CELLGRP will execute. This module adds new data to the cell buffer in an averaging method to indicate severity of lightning activity. The module CELL_MERGE combines cells that overlap boundaries. The modules that are remaining process the cell buffer data for the ARINC Processor. CKTSHLD flags the cells that have activity of four or more strokes. Then FIXAIR stores the vector magnitude and angle in relation to the fixed system activity for display. Finally INTEN figures the intensity of the cell from the number of strokes. This data is then ready to send to the I/O Processor. The module ADJCELL determines when a four (4) minute activity period for a lightning cell has transpired. Upon finding such a condition the data for that lightning cell is halved. The TASKINT module is locate in the main.c file.

Cell Grouping, Movement and Display Formatting

The TASKINT calls module Cellgrp that starts the following processing. UFPTAC module performs the updating utilizes the coordinate axis translation method. The data is kept in a Fixed Reference System in order to eliminate accumulative data loss. After translation has occurred then the new vector magnitude and angle are computed. In order to save processor time for the preferred embodiment a method was used to allow fast translation of the vector sums squared. An equation was used to allow fast computation so the square root would not have to be calculated (see UFPTAC routine for further explanation). The new vector magnitude and angle is used for cell grouping and for the statistical averaging method to the display.

The module CELLGRP (Cell group) processes the data from VFLASH for grouping with lightning cells in the same area. This is accomplished by first determining if the lightning cell and the new stroke are within a defined radius of each other. When a match is found the new stroke is added to the existing lightning cell and the one minute stroke buffer counter is updated. When a match is not found then the new stroke will create a new lightning cell. Intercloud strokes are handled differently. An intercloud stroke will try to find a lightning cell with the same angle. Upon finding a lightning cell the intercloud stroke will only update the activity time of the existing cell (remember that there is not enough information about this signal to calculate its range). Also a single intercloud stroke for the above will be sent to the display at that angle. When an intercloud stroke does not find a lightning cell in its same angle then a intercloud stroke is sent to the display screen at the calculated angle of the intercloud stroke. TASKINT calls the module ADJCELL every 0.5 seconds. ADJCELL performs and adjusts the number of strokes in a cell. This adjustment occurs when four minutes has transpired since the creation of this cell. The activity is halved. TASKINT calls module CKTSHLD every 0.5 seconds. CKTSHLD takes the cell data that CELLGRP has averaged and determines the minimum activity threshold. There are two values that determine the activity threshold. They are the last three minutes of activity and the cell activity count. Those cells above this threshold are then processed by CKTSHLD which sends the vector magnitude and angle to the ARINC buffer.

Navigational Aids, Cell Data and Mode Functions

The TASKINT module processes module READ_DISCRETES. READ_DISCRETES reads the Discrete input Ports B and D. The Modes are processed to determine Normal or Test operation. Upon Power-up, the RAM is tested. This routine is responsible for saving the current mode of the system in the Configuration register. The READ DISCRETES module is located in TASKINT module.

Power-Up and Support Modules

The remaining modules are used for Power-up and called arithmetic functions. Upon Power-up, the Processor configures itself. The Mode (configuration) register is read to determine the type of startup (cold or warm). The previous mode is used if a warm start is indicated. Then testing of the local RAM occurs. Finally, initialization of the variables and the hardware is performed before starting a continuous background BITE test.

Detail Description of Modules

Description of Module ARCTAN

ARCTAN generates the arc tangent of two arguments and returns the angle in Standard Angle Format. The resolution obtained is approximately 45 deg/1024=0.05 degrees. If both inputs are 0, ARCTAN returns a 45 degree angle.
The quadrant is determined by the sign of the opposite side and the adjacent side indicated in the table. The octant is derived by comparison of Abs (opposite) and Abs (adjacent) sides.

| OPPOSITE | ADJACENT | QUADRANT |
|----------|----------|----------|
| + | + | 1 |
| + | − | 2 |

-continued

| OPPOSITE | ADJACENT | QUADRANT |
|----------|----------|----------|
| −        | −        | 3        |
| −        | +        | 4        |

It is evident from the Table 14 that even parity is established by the three flag bits, the Angle=f(x, y)+offset. If parity is odd then the Angle=offset−f(x, y).

TABLE 14

Arctangent Quadrant Selection

| ANGLE OFFSET | DERIVED FUNCTION | FLAGS Y < 0 B3 | X < 0 B2 | X > Y B1 | B0 | PARITY |
|---|---|---|---|---|---|---|
| 0 | ATAN (Y/X) | 0 | 0 | 0 | 0 | E |
| 90 | 90 − ATAN (X/Y) | 0 | 0 | 1 | 0 | O |
| 180 | ATAN (X/Y) + 90 | 0 | 1 | 1 | 0 | E |
| 180 | ATAN (Y/X) + 180 | 1 | 1 | 0 | 0 | E |
| 270 | 90 − ATAN (X/Y) + 180 | 1 | 1 | 1 | 0 | O |
| 270 | ATAN (X/Y) + 270 | 1 | 0 | 1 | 0 | E |
| 360 | 90 − ATAN (X/Y) + 270 | 1 | 0 | 0 | 0 | O |

Inputs:

1. Opposite: side opposite the angle in signed 2's complement
2. Adjacent: side adjacent the angle in signed 2's complement Outputs:

1. Index: index word containing flags
2. Angle: angle in Standard Angle Format.

Subroutines Called:

None

Description of Module ARINC_RX1_INTERRUPT

The ARINC_RX1_INTERRUPT driver services the HI-8583(ARNIC 43) interrupt DR1 signal. The DR1 signal interrupts the Processor 41 on IRQA when there is an ARINC 429 word in the receiver #1 FIFO. The HI-8583 (ARNIC 43) sends the ARINC word to the FIFO when the word contains the required label. The interrupt module reads the 32 bit word in two 16 bit reads. The first read from address 0x4000 puts the data in ARINCRCV0. The next read from address 0x4001 is put in ARINCRCV1. Before restoring the registers, the RCV1FLAG is set to a value of one.

Description of Module ARINC_RX2_INTERRUPT

The ARINC_RX2_INTERRUPT driver services the HI-8583(ARNIC 43) interrupt DR2 signal. The DR2 signal interrupts the Processor 41 on IRQB when there is an ARINC 429 word in the receiver #2 FIFO. The HI-8583 (ARNIC 43) sends the ARINC word to the FIFO when the word contains the required label. The interrupt module reads the 32 bit word in two 16 bit reads. The first read from address 0x4002 puts the data in ARINCRCV0. The next read from address 0x4003 is put in ARINCRCV1. Before restoring the registers, the RCV1FLAG is set to a value of one.

Description of Module ARINC_INITIALIZE

The ARINC_INITIALIZE module initializes both of the ARINC receivers at power up. The receivers are identical in hardware operation. The set up of the HI-8583(ARNIC 43) is defined by writing to the control word located at 0x4002. The 16 bit control word is

TABLE 14

ARINC CONTROL WORD

| BIT | DESCRIPTION | SET | OUTPUT |
|---|---|---|---|
| CR0 | RECEIVER 1 | 0 | DATE RATE = CLK/10 |
|  |  | 1 | DATE RATE = CLK/80 |
| CR1 | LABEL | 0 | NORMAL |
|  |  | 1 |  |
| CR2 | RECEIVER 1 | 0 | DISABLE LABEL |
|  | ENABLE LABEL | 1 | ENABLE LABEL |
| CR3 | RECEIVER 2 | 0 | DISABLE LABEL |
|  | ENABLE LABEL |  | ENABLE LABEL |
| CR4 | ENABLE 32 BIT | 0 | TX $32^{nd}$ BIT AS DATA |
|  | AS PARITY | 1 | TX $32^{nd}$ BIT AS PARITY |
| CR5 | SELF TEST | 0 | INTERNAL CONNECT |
|  |  | 1 | NORMAL OPERATION |
| CR6 | RECEIVER 1 | 0 | DISABLE DECODER |
|  |  | 1 | CR7&CR8 MATCH BIT |
| CR7 | RECEIVER 1 | — | DECODER VALUE |
| CR8 | RECEIVER 1 | — | DECODER VALUE |
| CR9 | RECEIVER 2 | 0 | DISABLE DECODER |
|  |  | 1 | CR10&CR11 MATCH |
| CR10 | RECEIVER 2 | — | DECODER VALUE |
| CR11 | RECEIVER 2 | — | DECODER VALUE |
| CR12 | INVERT TX PARITY | 0 | ODD PARITY |
|  |  | 1 |  |
| CR13 | TX DATA CLK | 0 | DATA RATE = CLK/10 |
|  |  | 1 | DATA RATE = CLK/80 |
| CR14 | RCV2 CLK | 0 | DATA RATE = CLK/10 |
|  |  | 1 | DATA RATE = CLK/80 |
| CR15 | DATA FORMAT | 0 | SCRAMBLE |
|  |  | 1 | UNSCRAMBLE | defined in Table 14. The control word $A03C is written to address 0x4002. This puts HI-8583(ARNIC 43) receiver 1 and receiver 2 with data format unscramble, low speed, $32^{nd}$ bit parity and even parity. Next the routine sets up the label recognition for each receiver as shown in table 15. The RCV1FLAG and RCV2FLAG are cleared.

TABLE 16

Test Failure Codes

| CODE | FAILURE DESCRIPTION |
|---|---|
| 00* | NO FAILURES |
| 01 | POWER SUPPLY OUT OF TOLERANCE |
| 02 | RESERVED |
| 03 | RESERVED |
| 04 | DSP RAM FAILURE |
| 05 | RESERVED |
| 06 | RESERVED |
| 07 | RESERVED |
| 08 | RESERVED |
| 09 | RESERVED |
| 0A | RESERVED |
| 0B | RESERVED |
| 0C | K1 OUT OF RANGE |
| 0D | K2 OUT OF RANGE |
| 0E | K3 OUT OF RANGE |
| • | • |
| FF | RESERVED |

TABLE 15

ARINC LABEL

| LABEL (OCTAL) | DESCRIPTION |
|---|---|
| 10 | LATITUDE (BCD) |
| 11 | LONGITUDE (BCD) |
| 44 | HEADING |
| 310 | LATITUDE (BINARY) |
| 311 | LOGITUDE (BINARY) |
| 230 | TRUE AIRSPEED |

Description of Module BITE

BITE performs the Built-In test functions for Processor 41. These tests are as comprehensive as possible since this is the main maintenance tests for the processor. BITE is initiated on power-up and on command. The test is the following:

End-to-end
CPU integrity
RAM integrity
Analog inputs
RS-232 I/O activity
ARINC 429 RX1 input activity
ARINC 429 RX2 input activity
ARINC TX1 (MFD/DISPLAY) output activity
Discrete inputs activity The results of the BITE tests are encoded into a 16-bit failure (FAIL_CODE) code that shall be displayed on the LX-TEST display. If the failure is CPU, PROM, or RAM the BITE is "lock up" so that the unit does not attempt to use critical resources that may cause uncontrolled results. Activity checks are restricted to BITE initiated after the Processor 41 has been powered up. Several activity counters are used to detect valid operation of the hardware within a certain period of time. These counters provide extra BITE fault detection that would not be possible due to the restricted nature of the hardware. The bite test failure and hardware failure codes are shown in table 16 and 17.

Inputs:
1. Mode
2. Status
Outputs:
1. Fail_Code
2. Status
Subroutines Called:
1. CPU_CHECK
2. ROM_CHECK
3. RAM_CHECK
4. INTERRUPT_CHECK
5. WATCHDOG_CHECK
6. ANALOG_CHECK
7. SYSTEM_TEST_CALIBRATE Description of Module DISPLAY_TEST DISPLAY_TEST converts and formats the LX-TEST page data. It outputs signed BCD and hexadecimal data. The data includes:
1. NHF (signed 4-digit BCD): nose high frequency H-field
2. WHF (signed 4-digit BCD): wing high frequency H-field
3. EHF (signed 4-digit BCD): high frequency E-field
4. FIG (4-digit BCD): Data CPU Configuration
5. HDG (4digit BCD): aircraft heading
6. LAT (4-digit BCD): 360-degree Latitude
7. LON (4-digit BCD): 360-degree Longitude
8. FAL (4-digit HEX): Failure code(s)
1. PS1 (3-digit BCD): +5 Volt Power supply
2. PS2 (4-digit BCD): +12 Volt Power supply
3. PS3 (4-digit BCD): −12 Volt Power supply
4. PS4 (4-digit BCD): +3 Volt Power supply
9. FC (4-digit BCD): CPU Fault Codes The heading, latitude, and longitude must not only be converted to BCD but to 360-degree representation rather than their normal signed 180-degree representation.

TABLE 17

Hardware Failure Codes

| CODE | FAILURE DESCRIPTION |
|---|---|
| 00* | NO FAILURES IN LX SYSTEM |
| 01 | INVALID GND REFERENCE |
| 02 | ARINC PARITY |
| 03 | RESERVED |
| 04 | RESERVED |
| 05 | RESERVED |
| 06 | RESERVED |
| 07 | DISPLAY ERROR |
| 08 | HEADING ERROR |
| 09 | RESERVED |
| 0A | LATITUDE ERROR |
| 0B | LONGITUDE ERROR |
| 0C | RESERVED |
| 0D | RESERVED |
| 0E | RESERVED |
| • | • |
| FF | RESERVED |

Inputs:
1. Mode: Processor mode word
2. NHF: nose high frequency H-field
3. WHF: wing high frequency H-field
4. EHF: high frequency E-field
5. FIG: Data Configuration
6. HDG: aircraft heading
7. Latitude: 180-degree Latitude 8. Longitude: 180-degree Longitude
9. Status: Failure codes status
10. K1N (4-digit BCD): Angle Correction Factor—Nose
11. FC: CPU Fault Codes Outputs:
Subroutines called
1. HEX_CHARACTER
2. BINARY_TO_BCD Description of Module DISPLAY_MAINLINE DISPLAY_MAINLINE performs the DISPLAY message formatting in the DISPLAY_Buffer. The DISPLAY message is an ARINC 429 32-bit word with labels starting with 001 through 167 and a message terminator label of 377. All words to be transmitted have the parity bit set by the ARINC hardware. The buffer data format is defined by the selected aircraft display system. If the Mode is in TEST, the lightning data labels 100 through 167 are inhibited from transmission. Conversely, if Mode is other than TEST with the test page straps, then labels 002 through 037 are inhibited from transmission The DISPLAY lightning data is prioritized in the RHO-Theta format, so the DIO_Cell_Buffer is used for the cell data. If the Flash bit of the Configuration_Straps is low, then the DIO_Flash_Buffer is also transmitted.

Inputs:
1. Mode
2. Configuration_Straps
3. DISPLAY_Pointers

Outputs:
1. Inactive_DISPLAY_Buffer

Subroutines Called:
1. T429DISCRETES
2. T429TESTPAGE1
3. T429TESTPAGE2
4. DISPLAYPRIORITIZECELLS
5. T429FORMATCELLS
6. T429FAULTCODES
7. T429TERMINATION Description of Module READ_DISCRETES The READ_DISCRETES procedure reads the Discrete_Inputs, and Calibration_Inputs via lines 63 (FIG. 5). These I/O ports are stored into RAM variables for use by the other software modules. If there is a discrete error where NORMAL, Stand By and Clear/Test are all inactive, Standby is the default.

Inputs:
1. Discrete_Inputs: word data port B
2. Calibration_Inputs: word data port B and D
3. Mode Outputs:
1. Discrete_Data: debounced data from Discrete_Inputs
2. Calibration_Data: debounced data from Calibration_Inputs
3. Mode Subroutines Called:
one Description of Module UPDATE_AC_POSITION TASKINT calls UPDATE_AC_POSITION every 0.5 seconds for the preferred embodiment. UPDATE_AC_POSITION takes ARINC 419 and 429 latitude and longitude data, checks parity if its ARINC 429, and generates any changes in X, Y position. These are represented in steps of 0.25 nautical miles. The DELTA_X and DELTA_Y are computed from the change in longitude and latitude since the Reference_Latitude and Reference_Longitude that caused a delta greater than 0.25 miles. The coordinate system is +Y=True North and +X=East. Until the delta exceeds 0.25 miles, this routine returns a delta change of zero and retains the Reference_Latitude/Reference_Longitude of the last position that caused a 0.25 mile delta for that reference.

Longitude and Latitude representations are always converted to the ARINC 429 binary format where the LSB=180/2**20 degrees and sign extended to 32-bits, then the following equations will produce a rounded Delta_X/Delta_Y when truncated to 0.25 nautical miles. The magnitude rounding is used to avoid the bias that truncation produces $Delta\_X = (Longitude - Reference\_Longitude) * Nav\_Scale + Magnitude\_Round$ $Delta\_Y = (Latitude - Reference\_Latitude) * Nav\_Scale + Magnitude + Round$ where:

$Nav\_Scale = (60 \text{ nm/degree} * (180/2**20) \text{degree}/LSB) = 0.010299682 \text{ nm}/LSB$ $Magnitude\_Round = Sign\_of\_Delta * (0.25 \text{ nm}/2 * 0.010299682 \text{ nm}/LSB)$

1. SUM

Description of Module ADJCELL

PURPOSE: This procedure removes old data from the cell buffer.

PROCESSING:

The cell buffer is searched for cells that are four minutes old. Cells containing old data that have two or more strokes are adjusted by reducing the number of strokes by one-half, adjusting the sum-of-X's and Y's (XSUM, YSUM), sum-of-squares-of ranges (RGSQSUM), and incrementing the number of 4 minute inactivity cycles for the cell accordingly, and setting a new old data indication time (AJTIME). If the cell contained only one stroke it is flagged as inactive. A count of the number of inactive cells is maintained and checked against the cell count (CELLCNT) prior to exiting the procedure. If the cell buffer does not contain any active cells CELLCNT is reset to zero.

The procedure first sets the index to the cell buffer (SI) and the inactive cell count (DI) to zero. If CELLCNT=0 the procedure is exited. Otherwise, the cell buffer is processed. The process starts by determining if the cell is active. If not active DI is incremented and the next cell obtained. If the cell is active the time to adjust the cell for old data (AJTIME) is compared with the current time the cell for old data (AJTIME) is compared with the current time (CRTIME). If they are equal the cell contains old data and must be adjusted. Otherwise, the next cell is obtained and processed. If a cell contains old data the number of strokes in the cell are checked. If the cell contains only one stroke the cell is set to inactive, DI is incremented, and the next cell obtained for processing. If the cell contains two or more strokes it is adjusted as follows.

$AVE\_X[SI] = XSUM[SI]/NUMSTR[SI]$ $AVE\_Y[SI] = YSUM[SI]/NUMSTR[SI]$ $RGSQSUM[SI] = RGSQSUM[SI]/NUMSTR[SI]$ $NUMSTR[SI] = NUMSTR[SI]/2$ $X\text{SUM}[SI]=AVE\_X[SI]*\text{NUMSTR}[SI]$ $Y\text{SUM}[SI]=AVE\_Y[SI]*\text{NUMSTR}[SI]$ $AVE\_\text{RANGE}[SI]=\text{SQRT}\{AVE\_X[SI]2+AVE\_Y[SI]2\}$ $\text{RGSQSUM}[SI]=\text{RGSQSUM}[SI]*\text{NUMSTR}[SI]$ $\text{INACTIVITYCNT}[SI]=\text{INACTIVITYCNT}[SI]+1$ where $X$SUM=HXNSUM:LXNSUM $Y$SUM=HYNSUM:LYNSUM

RGSQSUM=HRGSQSUM:LRGSQSUM

The adjustment accounts for truncation due to integer math. The newrawdata flag is set before exiting this routine to tell the CTINT interrupt routine that new data exists to be processed to the display processor. The next cell is obtained for processing by incrementing SI to point to the next cell and comparing SI with CELLCNT. If SI<CELLCNT the next cell is processed. Otherwise, all cells have been checked and the number of inactive cells is compared with the cell count. If DI=CELLCNT the cell buffer does not contain any active cells CELLCNT is reset to zero and the procedure exited. Otherwise, the procedure is exited without changing CELLCNT.

Inputs:
1. AVE_RANGE: average range to cell fixed system sum of X's to each stroke hi word fixed system
2. LXNSUM SUM OF X's: To each stroke low word fixed system
3. HUNSUM SUM OF Y's: To each stroke hi word fixed system
4. LYNSUM SUM OF Y's: To each stroke low word fixed system
5. HRGSQSUM: Sum of squares of ranges hi word
6. LRGSQSUM: Sum of squares of ranges low word (B4)
7. NUMSTR Number of strokes in cell
8. AJTIME: Time to adjust cell for old ATAT
9. ACTIVE: Active cell flag
10. INACTIVITYCNT: Inactivity count flag for removing oldest cell data when buffer full
11. AVE_X: Average X to cell
12. AVE_Y: Average Y to cell
13. CELLCNT: Twice number of cells in cell buffer
14. CRTIME: Current time Outputs:
1. AVE_RANGE: Average range to cell fixed system
2. HXNSUM: Sum of X's to each stroke hi word fixed system
3. LXNSUM: Sum of X's to each stroke low word fixed system
4. HYNSUM: Sum of Y's to each stroke hi word fixed system
5. LYNSUM SUM OF Y's: To each stroke low word fixed system
6. HRGSQSUM: Sum of squares of ranges hi word
7. LRGSQSUM: Sum of squares of ranges low word (B4)
8. NUMSTR: Number of strokes in cell
9. AJTIME: Time to adjust cell for old data
10. ACTIVE: Active cell flag
11. INACTIVEITYCNT: Inactivity count flag for removing oldest cell data when buffer full
12. AVE_X: Average X to cell
13. AVE_Y: Average Y to cell
14. CELL CNT: Twice number of cells in cell buffer Subroutines Called:
1. SQRTSUM

Description of Module AIRFIX

AIRFIX transforms the range and bearing to the stroke from the NC to the fixed reference system. The angle theta in the fixed reference system is computed along with the distance x and y from the aircraft to the stroke in miles for summing by the module CELLGRP.

Processing:
AIRFIX transforms the angle and range to the stroke referenced from the NC to the fixed system Xn and Yn distance and angle.
First compute the angle theta to the cell in the fixed reference system.

theta=$str$_angle+heading

Now compute the sine and cosine of the angle theta to be able to compute the x and y distance in the fixed reference system. Use lookup table for sine and cosine!
XN is computed by multiplying the range (RNG) by the cosine.

$XN=RNG*\text{COS}$

Store XN for processing in the module CELLGRP.
YN is computed by multiplying the range (RNG) by the sine.

;$YN=RNG*\text{SIN}$

Store YN for processing in the module CELLGRP.

Inputs:
STR_ANGLE: angle to stroke from nose of NC clockwise (SAF)
STR_RNG: range to flash from NC (B2)
STRCNT: number of valid return strokes in flash (B0)

Outputs:
XN: Distance in X Fixed System from NC to return Stroke (B2)
YN: Distance in the Y Fixed System from A/C to return Stroke (B2)
ANGLE_THETA_TN: Angle from fixed reference system to the cell (SAF)

Subroutines Called:
SINCOS: LOOKUP THE SIN AND COS OF THE ANGLE INPUTTED

Description of Module BINBCD

This module will take up to 12 bits of binary data and convert to three BCD digits with sign for display. The input will reside in the AX register. Three divides are used to convert the binary to BCD digits. These digits are saved and packed into one 16 bit word and returned in the AX register.

Inputs:
1. AX binary data 9999

Outputs:
1. AX packed BCD data

Subroutines Called:
None

Description of Module CELLGRP

This procedure compares the lightning strokes processed by AIRFIX with the cells in the cell buffer. If the stroke is within a predefined radius of an existing cell it is added to that cell. For the preferred embodiment the radius is 7 nautical miles. Otherwise, it is added to the cell buffer as a new cell.

> Note! This routine has added to it code to reorder the cell buffer from smallest to largest using the AVE_RANGE values for selection.

The location of the return strokes in the present aircraft position are used to update existing cells or generate new cells in the cell buffer. If a stroke is within the predefined radius of an existing cell in the cell buffer its data will be used to update that cell. If a stroke does not fall within the predefined radius of any existing cell its data is used to generate a new cell in the cell buffer. If a previous cell has become inactive the new cell will be stored in that location in the cell buffer. Otherwise, new cells will be added to the end of the cell buffer until it is full. Once the cell buffer is full, any new cells will be ignored. The maximum number of cells allowed in the cell buffer can be adjusted by setting MAXCELLS in the code segment. It is now at 50. CKSTR, CELLCNT, and MAXCELLS are twice the number of strokes and cells respectively to allow for checking against the word addressing pointers SI and DI. The procedure first obtains the stroke count (STRCNT), doubles it, and places it in CKSTR for use in checking the word pointer to the strokes for the end of data. The index to the table of strikes (BP) and (SI) is set to zero. Flags are zeroed and the intercloud ranges and angles are preset to zero. The index to the cell buffer (DI) is set to zero before each stroke is compared to the cells in the cell buffer.

The search for a cell which the stroke matches is started by comparing DI with twice the number of cells (CELL-CNT). If DI is greater than or equal to CELLCNT the stroke did not match any of the active cells. Next a check is made to determine if this stroke was invalid. If yes, then throw away this stroke. If no, then a check is made to determine if this stroke was an intercloud count. If yes, then store the intercloud angle, set range to zero, then increment the stroke pointer. If no, then check for the stroke being less than 200 nm. If not, then throw away this stroke and increment the stroke pointer. If yes, then the stroke is added as a new cell. Otherwise, the active flag for the cell is checked. If the cell is not active DI is incremented to point to the next cell and the search started again.

1. If range to stroke is 250 nm then this stroke is faulty and throw it away.
2. If range to stroke is 300 nm then process as an intercloud.
3. If range to stroke is 210 nm then use this stroke.

If the cell is active the difference in range between the stroke and cell is computed.

$$temp=abs(X-Xs)$$

$$temp2=abs(Yc-Ys)$$

$$temp3=STR\_RNG/4$$

If temp or temp2 is greater than one fourth the stroke range (temp3) of a cell (CELLRAD) the stroke is not a member of the cell. Increment DI and continue the search. Otherwise, the stroke is a member of the cell and is added to it through the following equations.

$$XSUM(DI)=XSUM(DI)+X(SI)$$

$$YSUM(DI)=YSUM(DI)+Y(SI)$$

$$RGSQSUM(DI)=RGSQSUM(DI)+RGSIRG(SI)$$

$$NUMSTR(DI)=NUMSTR(DI)+1$$

$$MIN\_STROKE\_BUFDIBX=MIN\_STROKE\_BUFDIBX+1$$

$$INACTIVITYCNTCNTSI\ 0$$

$$WHERE\ XSUM=HXNSUM+LXNSUM$$

$$YSUM=HYNSUM+LYNSUM$$

$$RGSQSU=SRGSQSUM+LRGSQSUM$$

Is this the biggest strike for this buffer? If not, then continue. If yes, then sand the coordinates to put a flash to the display screen.

$$RFLASHR(DI)=R(SI)$$

$$RFLASHT(DI)=THETA\_TNSI$$

SI is incremented to point to the next stroke and compared with the stroke count. If SI. STRCNT, DI is reset to zero and the cells searched for a match to this next stroke. Otherwise, all of the strokes have been processed and the following function are then executed.

Intercloud processing is next. In order to not have sign problems the angles are taken from SAF to a (b15) number before the subtraction. This allows checking for large and negative numbers before proceeding. If the difference is greater than defined minimum angle between the cell and the intercloud it is not a member of the cell. Increment DI and continue the search. If the difference is less than or equal to the CELLANG then a match has been found. Increment the minute intercloud buffer count.

Lightning alerts will be sent to the display. The maximum range of the display is used to compute the range of the lightning alert (flash) sent to the display processor. Only a maximum of 2 lightning alerts are sent to the display processor at one time. Also these two (flashes) can not be within 7 degrees of each other to both be displayed.

Now add the New Cell Additions. If a stroke is to be added as a new cell, DI is first reset to zero and all cells checked to determine if an inactive cell exists in the cell buffer. The new cell is stored in the location of the first inactive cell encountered. If there are no inactive cells the number of cells is checked against the maximum allowed. If the cell buffer is full no more new cells are added. Otherwise, the stroke is added to the end of the current cells as a new cell. A new cell is added to the cell buffer with the following equations and the cell active flag set. Note that all four one minute stroke and one minute intercloud buffers for this cell must be zeroed when creating this new cell.

$$XSUM\ SXUM(DI)=X(SI)$$

$$YSUM(DI)SYUM(DI)=Y(SI)$$

$$THETA\_TN(DI)=ANGLE\_THETA\_TN(SI)$$

$$AVE\_RANGE(DI)=STR\_RNG(SI)$$

$$RGSQSUM(DI)=RGSI\ RGSI$$

$$INACTIVITYCNT(SI)=0$$

$$NUMSTRDI=1$$

$$AJTIME(DI)=CRTIME$$

$$MIN\_STROKE\_BUFDIBX=1$$

$$ACTIVE(DI)=1$$

See if we have looked at all the cells. SI is incremented to point to the next stroke and compared with the stroke count. If SI STRCNT, DI is reset to zero and the cells searched for a match to this next stroke. Otherwise, all of the strokes have been processed.

Now compute new averages. Now the new ave_ranges must be computed. We must get the ave X's and Y's and call sqrtsum to obtain the average ranges. Only done for the cells that have had data added to them.

ave $X$=Sxumsdi/numstrdi ave $Y$-Yεumε(DI)

ave_range=sqrt($xx+yy$)

Now do the Cell buffer ordering. This processing was required to allow interclouds to be added to the closest cell to the aircraft first. A decreasing loop test is used which tests fewer and fewer cells. The data items change place upon a closer value being found. The only time the buffer items change place is when a closer value is found. Therefore, this process should be very fast with little reordering taking place.

Inputs:
1. XN: Distance in X from NC to stroke fixed system
2. YN: Distance in Y from A/C to stroke fixed system
3. ANGLE_THETA_TN: Angle of cell in fixed reference system
4. HRNGSQ: High word for the square of range (B4)
5. LRNGSQ: Low word for the square of range (B4)
6. STRCNT: Number of valid return strokes
7. CRTIME: Current time
8. STROKE: Buffer of the current stroke data Outputs:
1. THETA_TN: Angle to cell in a fixed reference system
2. AVE_RANGE: Average range to cell fixed system
3. HXNSUM: Sum of X's to each stroke hi word fixed system
4. LXNSUM: Sum of X's to each stroke low word fixed system
5. HXNSUM: Sum of Y's to each stroke low word fixed system
6. HRGSQSUM: Sum of squares of ranges hi word
7. LRGSQSUM: Sum of squares of ranges low word (B4)
8. NUMSTR: Number of strokes in cell
9. AJTIME: Time to adjust cell for old data
10. ACTIVE: Active cell flag
11. INACTIVITYCNT: Inactivity count flag for removing oldest cell data when buffer full
12. SUM_ACTIVE: Indicate that data has been summed into this cell.
13. MIN_STROKE_BUFF_PTR: Pointer that points to buffer being filled.
14. MIN_INTERCLOUD_BUF: 4 buffers that hold one minute sums of the number of interclouds.
15. MIN_INTERCLOUD_BUF_PTR: pointer that points to buffer being filled.
16. AVE_X: Average X to cell
17. AVE_Y: Average Y to cell
18. CELLCNT: Twice number of cells in cell buffer
19. FLSTRCNT: Number of strokes in flash Subroutines Called:
1. SQRTSUM: Near square root of the sum of the squares

Description of Module CELL_MERGE

This procedure compares the cells in the cell buffer to themselves in order to remove any overlap of two or more cells. If a cell is within predefined limits in range of an existing cell it is added to the first cell and then deleted from the buffer. Otherwise, it is left alone.

CELLCNT is twice the number of cells to allow for checking against the word addressing pointers SI and DI.

Find an active cell and use it for the first test cell. First the address pointers SI and DI are zeroed. The search for a cell which is active is started by comparing DI with twice the number of cells (CELLCNT). If DI is greater than or equal to CELLCNT there are no active cells and we exit this routine. Otherwise, the active flag for the cell is checked. If the cell is not active DI is incremented to point to the next cell and the search started again. If the cell is active then the address pointer (SI) for the test cell is initialized to DI. The search for a cell which is active is started by comparing DI with twice the number of cells (CELLCNT). If DI is greater than or equal to CELLCNT then we have reached the end of the cell buffer and are done for this pass. Otherwise, the active flag for the cell is checked. If the cell is not active DI is incremented to point to the next cell and the search started again. If the cell is active the difference in range between the cell and test cell is computed.

temp=($Xc-Xs$)

temp2<=($Yc-Ys$)

temp3=$STR\_RNG/4$

If temp or temp2 is greater than one fourth the stroke range (temp3) of a cell (CELLRAD) the cells should not be merged. Increment DI and continue the search. Otherwise, the cells should be merged and are added together through the following equations.

$X$SUM($SI$)+SXUM($DI$)=$X$SUM($SI$)

$Y$SUM($SI$)+$Y$SUM($DI$)=$Y$SUM($SI$)

RGSQSUM($SI$)+RGSQSUM($DI$)=RGSQSUM($SI$)

NUMSTR($SI$)+NUMSTR($DI$)=NUMSTR($SI$)

MERGE_INDEX_ACTIVE($SI$)+1

ACTIVE($DI$)=0

AJTIME($SI$) This cells timer count

MIN_STROKE_$BUF$($SI$)=MIN_STROKE_$BUF$($SI$)+ MIN_STROKE_$BUF$($DI$)(done for all four buffers)

WHERE $X$SUM=HXNSUM:LXNSUM $Y$SUM=HYNSUM:LYNSUM

RGSQSUM=SRGSQSUM:LRGSQSUM

Check to see if DI is less that CELLCNT. If yes, then continue with search for merging of cells. If not, then increment the test cell address (SI). Check to see if SI is greater than or equal to CELLCNT to indicate merging has completed. If not, then increment the test cell address (SI). Check to see if SI is greater than or equal to CELLCNT to indicate merging has completed. If not, then check to see if this test cell is active. If not active then loop until an active test cell is found or we have reached the end of the buffer. If active, then make DI equal to SI so the searching of the cell buffer will only include those items which have not been used as a search test item. Now the new ave_ranges and theta_tn's must be computed. We must get the ave X's and Y's and call sqrtsum to obtain the average ranges. Then call the arctan routine to obtain the angle to the cell.

$ave\ X = X\text{sums}(DI)/\text{numstr}(DI)$ $ave\ Y = Y\text{sums}(DI)/\text{numstr}(DI)$ $ave\_\text{range} = \text{sqrt}(xx+yy)$ $\text{theta\_tndi} = \arctan(ave\ X/ave\ Y)$ Finally the value of CELLCNT must be verified. During merging the number of cells in the buffer may have been adjusted. The only cells that affect the CELLCNT are the last cells in the buffer.

Inputs:
1. THETA_TN: Angle to cell in a fixed reference system
2. AVE_RANGE: Average range to cell fixed system
3. HXNSUM: Sum of X's to each stroke hi word fixed system
4. LXNSUM: Sum of X's to each stroke low word fixed system
5. HYNSUM: Sum of Y's to each stroke hi word fixed system
6. LYNSUM: Sum of Y's to each stroke low word fixed system
7. HRGSQSUM: Sum of squares of ranges hi word
8. LRGSQSUM: Sum of squares of ranges low word (B4)
9. NUMSTR: Number of strokes in cell
10. AJTIME: Time to adjust cell for old data
11. ACTIVE: Active cell flag
12. MIN STROKE_BUF: 4 buffers that hold one minute sums of the number of strokes
13. MIN INTERCLOUD_BUF: 4 buffers that hold one minute sums of the number of interclouds.
14. AVE_X: Average X to cell
15. AVE_Y: Average Y to cell
16. CELLCNT: Twice number of cells in cell buffer Outputs:
1. THETA_TN: Angle to cell in a fixed reference system
2. AVE_RANGE: Average range to cell fixed system
3. HXNSUM: Sum of X's to each stroke hi word fixed system
4. LXNSUM: Sum of X's to each stroke low word fixed system
5. HYNSUM: Sum of Y's to each stroke hi word fixed system
6. LYNSUM: Sum of Y's to each stroke low word fixed system
7. HRGSQSUM: Sum of squares of ranges hi word
8. LRGSQSUM: Sum of squares of ranges low word (B4)
9. NUMSTR: Number of strokes in cell
10. AJTIME: Time to adjust cell for old data
11. ACTIVE: Active cell flag
12. MIN_STROKE_BUF: 4 buffers that hold one minute sums of the number of strokes
13. MIN_INTERCLOUD_BUF: 4 buffers that hold one minute sums of the number of interclouds.
14. AVE_X: Average X to cell
15. AVE_Y: Average Y to cell
16. CELLCNT: Twice number of cells in cell buffer Subroutines Called:
1. ARCTAN: Near returns the angle THETA
2. SQRTSUM: Near square root of the sum of the squares Description of Module CKTSHLD This procedure checks the lightning cells stored in the cell buffer for activity. If an active cell is not above a certain threshold it is not processed for display. It also serves as the calling procedure for the other modules in the main path of the Display Preparation function. The lightning cells in the cell buffer are processed sequentially. If a lightning cell is inactive or contains less than two strokes it is not processed for display. CELLCNT is twice the number of cells currently in the cell buffer to allow checking for the end of the cell buffer with the word addressing pointer SI. The procedure first sets the index to the cell buffer SI to zero to point to the first cell. The process starts by checking the active flag of the cell. If the cell is active the number of strokes in the cell (NUMSTR) or the sum of the one minute stroke buffers is checked against the threshold. If larger value is 1 the cell is processed for display. When a minimum of 1 stroke exists and the number of interclouds is greater than 2 then an intensity level one cell will be displayed. If the cell is inactive or the larger value contains less than two strokes and the number of interclouds is less than 3 it is not processed for display and the next cell is obtained for processing, as described later. Data from a cell to the processed for display is temporarily stored in a buffer, along with a cell identifies (CELLTAG), as follows:

$T\_THETA\_TN = THETA\_TN(SI)$ $AVE\_RANGE = AVERANGE(SI)$ $THSQSUM = HSQSUM(SI)$ $TMSQSUM = MSQSUM(SI)$ $TLSQSUM = LSQSUM(SI)$ $TNUMSTR = NUMSTR(SI)$ $CELLTAG = SI$ $T\_HEADING = SHEADING$ $T\_INTEN\_STR$ Larger value($numstr(SI)$ or $sum$ of one minute stroke buforε)

[1 stroke and 3 or more interclouds intensity 1]

This buffer is then used by the FIXAIR and INTEN modules within CKTSHLD to process the cell for output to the display processor. These modules are sequentially called by this procedure. The next cell is obtained for processing by incrementing SI to point to it and comparing SI with the cell count (CELLCNT). If SI CELLCNT the next cell is processed. Otherwise, all cells have been checked and the procedure is exited.

Inputs:
1. THETA_TN: Angle to cell (SAF)
2. AVE_RANGE: Average range to cell (B2)
3. HRGSQSUM: Sum of squares of ranges hi word
4. LRGSQSUM: Sum of squares of ranges low word (B4)
5. NUMSTR: Number of strokes in cell
6. ACTIVE: Active cell flags
7. CELLCNT: Twice number of cells in cell buffer
8. SHEADING: Smoothed heading of aircraft (SAF)

Outputs:
1. T_THETA_TN: Temp hold THETA to process
2. TAVE_RANGE: Temp hold average range to process
3. TLRGSUM: Temp hold LRGSUM for processing (B2)

4. THSQSUM: Temp hold HSQSUM for processing
5. TMSQSUM: Temp hold MSQSUM for processing
6. TLSQSUM: Temp hold LSQSUM to processing (64)
7. TNUMSTR: Temp hold NUMSTR for processing
8. CELLTAG: Cell identifier
9. T_HEADING: Temp hold heading to process Subroutines Called:
1. FIXAIR NEAR SAVE RHO, THETA
2. INTEN NEAR ESTABLISH CELL INTENSITY Description of Module CTINT CTINT is the interrupt handler for the TIMER 1 interrupt. CTING updates CRTIME, calls CELL MERGE, ADJCELL, UFPTAC, CELLGRP and CKTSHLD. This interrupt handles the updating of the Cell Buffer to the new Aircraft Position. Adds new stroke data into the Cell Buffer. CTINT loads the ES register with the address of the CONTROL segment. Then interrupts are enabled. The routine Fixed Point to Aircraft (UFPTAC) is called to update the Fixed Point to the current aircraft position. When new raw stroke data is present to be added to the cell buffer then CTINT routing calls the cell buffer grouping program (CELLGRP). The CTINT routine increments the CRTIMECNT and compares it to 20. If it is less, then process the cell buffer to the display processor by calling CKTSHLD and then CELLTOMB. If CRTIMECNT is greater than or equal to 20, it is set back to zero. Upon reaching 20 this means that 10 seconds has transpired. When one minute has transpired then change the one minute stroke buffer pointer to point to the next buffer. CELLGRP sums the number of strokes that occurred during a one minute time period into its appropriate one minute stroke buffer for use by the CKTSHLD routine. Also zero the one minute stroke buffer that is now to be used. By the way there are only 4 one minute stroke buffers available and they are used in a round robin fashion. Three have old data in them while the fourth one is now collecting new data. Then it increments CRTIME and compares it to 23. If it is less than or equal, CELLCNT is compared to zero. If CRTIME is greater than 23, it is set back to zero. Now call the CELLMERGE routine to determine if 2 or more cells should be merged. The CELLCNT is compared to zero. If CELLCNT is zero, ADJCELL is not called because there are no cells to check-adjust for old data. If CELLCNT is greater than zero, then ADJCELL is called to check the lightning cells for old data. The newrawdata flag is set to indicate that cell data is to be processed to the I/O Processor. The different data flag types are used to create the data type for the I/O Processor to display. Next the cell buffer is processed into the format for the I/O Processor by calling CKTSHLD. The ES register is restored and the Clear screen flag is cleared. Finally the EOI register is set to 8000H to clear the TIMER 1 interrupt. The ES and other registers are restored and the interrupt handler exits.

Inputs:
1. CRTIME: Current time

Outputs:
1. CRTIME: Current time

Subroutines Called:
1. ADJCELL NEAR ADJUST LIGHTNING CELLS FOR OLD DATA
2. CKTCHLD NEAR CHECK CELL ACTIVITY THRESHOLD
3. UFPTAC NEAR UPDATE FIXED POINT TO PRESENT AIRCRAFT POSITION
4. CELLGRP NEAR CELL GROUP DETERMINATION
5. CELLMERGE NEAR MERGE TWO OR MORE CELLS IF WITHIN EACH OTHERS BOUNDARIES Description of Module GET_RAW_DATA This procedure locates the high frequency lightning data stored in the raw data buffer by the hardware. It filters out extraneous signals not removed by the hardware. The raw data buffer contains lightning data stored over a 1 millisecond time frame. It consists of 375 groups of high frequency magnetic and electric signals. The magnetic data is stored in DataOBuf and the electric is stored in EBUF1. The signals have an offset of approximately 1.6 volts. Gain adjustments K1N, K1W and E1 are measured in the start module and used by this module to remove the offset value. The procedure first looks to see if the old data has been processed by checking FLAG DEL_DMA_DATA. The procedure is exit if the old data is being processed. Next the CALIBRATE FLAG is checked to see if in calibration mode. If the Dflag FLAG indicates there is data in the raw buffer, the electric buffer EBUF1 data is adjusted for the 1.6 volt offset by using the gain adjustments E1. The largest signal found in the buffer is checked to see if it is above the Threshold. If the peak is not to close to the start of the buffer (4 s) or to close to the end of the buffer (60 s), the rise time of the pulse is measured and checked to see if it is at least 4 s but not greater than 24 s. Next the width of the pulse is measured. The rise to peak of the signal must be less than ¼ the width of the pulse. The pulse width must be less than 60 s but greater than 16 s. If the start of the electric pulse is at least 30 samples from the end of the buffer the magnetic fields are tested.

First the procedure adjusts 60 s of the magnetic data for the 1.6 volt offset and moves the data to the newdata_HEW and newdata_HNS buffers. This 60 s data is from the same time position corresponding to the electric pulses start location. The magnetic data is filtered by an 8 s average. If the peak magnetic value is above the Threshold, the data is checked to see if the peak value has shifted up to 8 s from the location in time from the electric pulse. The maximum magnetic value is stored in HNSmax and HEWmax. Next the 60 s of the electric pulse is saved in the newdata_E and then the DEL_DMA_DATA FLAG is set to stop further data from being collected and the Startflag is set. If the first pulse found in the buffer is not valid, the electric value for the pulse is set to zero. The EBUF1 buffer is checked again for a pulse above the Threshold. If one is found the above procedure is repeated. The procedure now tests the magnetic pulse to see if present. Next look at 40 us on data starting at the electric pulse. Find which magnetic (HNSmax or HEWmax) is strongest and what is the slope. The magnetic signal has three peak voltages. The first peak should match the time of the electric signal and is the peak with amplitude data. The second and third peaks are related to the pulse width. The amplitude of the peak and time of peak relate to the shape of the pulse. A lightning pulse will have these three peaks. The second peak will be about 14us from the first peak and have opposite polarity of the first peak. The Third peak will have the same polarity as first and will be 28 us from first peak. The procedure checks that the magnetic signal is in the correct position relative to the electric peak. The procedure moves the magnetic data to the buffer and converts the raw data for the offset. Next test to see if there are two other peaks in the correct position. Use the largest magnetic channel to meet the requirement:

V1 is 509. V2 is 511. V3 is 513 in FIG. 6

0.25*V2<V1<V2

0.5*V2<V3<1.25*V2

Registers at this point are:

R2=Position of maximum magnetic peak

B1=Magnetic peak location in buffer

Test the time to second peak to be 5<time<8. This is a lightning pulse so set Flag:

Fstartflag=1

Inputs:

1. DEL_DMA_DATA: Flag to stop processing raw buffer

2. Data1Buf: magnetic raw buffer

3. EBUF1: electric raw buffer

4. K1N, K1W and E1: offset for the magnetic and electric channels.

Outputs:

1. newdata_HNS: magnetic HNS data for a 60 s pulse 2. newdata_HEW: magnetic HEW data for a 60 s pulse 3. newdata_E: electric data for a 60 s pulse 4. Startflag: set when new data is in buffer Subroutines Called:

1. none

Description of Module INITIAL

INITIAL first loads the interrupt vector addresses in RAM starting at 0000H. The control block registers for the DMA controller, the TIMER controller, and the INTERRUPT controller are then loaded with their proper values. In the TIMER controller, TIMER0 is not used. The count register, max count A register, and max count B register are all zeroed. The mode control register for TIMER0 is set to 400H to inhibit TIMER0 from producing an interrupt to the processor. TIMER1 has count register and max count B register zeroed. Max count A register is set to a value of 3792. TIMER1 mode control register is to enable an interrupt to the processor, using TIMER2 as a prescaler, and runs continuously. TIMER2 has the count register zeroed. The max count register is also set to a value of 3792. The mode control register is set to inhibit an interrupt to the processor, runs off the processor internal clock, and runs continuously. With TIMER1 prescaled by TIMER2 and both set to the value of 3792, TIMER1 will interrupt the processor approximately every 0.5 seconds. Last, in the INTERRUPT controller, the controller registers set the priority of each of the interrupts. INT2 has the highest priority, TIMER has second, INT0 has the third priority. INT1, DMA CHANNEL 0, and DMA CHANNEL 1 are all masked off. The interrupts are not nested or cascaded. They are all level triggered. The priority mask register is set to 3 to mask off any interrupts with a priority lower than INT0. The mask register is set to 2 C to mask off any other interrupts besides TIMER, INT2, and INT0. Finally the type of start-up is determined and the proper variable initialization is performed. INITIAL now enables all maskable interrupts that were disabled in HWINIT.

Inputs: Starting address of:

1. Reboot system restart

2. OVRINT divide overflow interrupt handler

3. TASKING 1.4 second interrupt handler

4. RTCING 133 ms interrupt handler

5. CTING 0.5 second interrupt handler

Outputs:

1. Control register

Subroutines Called:

None

Description of Module MONITOR

To perform the interactive BIT, background testing and automatic gain calibration. This routine performs the outputting of targets for all three test modes—Normal test, noise test and single pulse test. Also this routine calls the Calibration monitor routine upon power-up or initialization only. This routine performs the self test of the lightning system. When in the test mode this routine will output a target at 25 nautical miles and 45 degrees. These pulses must be 10 milliseconds apart. Up to thirty pulses of each distance are output and then a wait loop is entered into waiting for a 1.4 second interrupt. Upon receiving this interrupt the system will do this for as many times as directed in order to produce different intensity targets. Upon completion of the above this routine will verify that a3 cell exists at 45 degrees 5 degrees and at it's respective range 10 percent. Upon a failure an error code is sent to the RTCINT routine for processing to the I/O Processor.

Inputs:

None

Outputs:

None

Subroutines Called:

None

Description of Module MON_CAL

This routine controls the communication and calling of the calibration modules and functions. Also checks for stuck channels and high noise environments. Upon entering the calibration monitor/controller the following events must take place in a timed sequence as follows:

1. Zero the 133 millisecond counter/timer for checking on a response from the Processor.

2. The Processor must put the antenna in BIT (Test) mode. Now the Processor must indicate that the above two functions have been accomplished by setting the acknowledge calibration. The processor will wait for 5 seconds for the above response from the I/O Processor before timing out. A time-out aborts calibration and sets appropriate error bits in the mailbox. This is the controlling routine for the calibration function. The calibration function only operates once upon power-up. First clear all flags. Now tell the I/O Processor to enable the antenna for low gain and test mode. Wait for 5 seconds for the I/O Processor to tell us (DATA processor) that the above was completed. Upon time-out set error flags and get out of calibration. After receiving a response from the I/O Processor then continue.

The antenna hardware and the software must be initialized to guarantee that one test pulse gets through the first 1.4 second raw data buffer interrupt. Also zero out the software interrupt counter/timer variables. Next output a test pulse ratio for a 25 nautical mile strike. Wait for 1.6 seconds in order to receive the pulse outputted. A time-out will cause an error and the calibration routine will be exited. Upon receiving the test pulse data then check for any one of the high or low frequency channels being struck high or low. An error will be flagged for the specific channel being stuck and this routine will be exited. After passing this check proceed to the noise check. The antenna hardware end the software must be initialized to guarantee that the data received during this 1.4 second raw data buffer indicates the lightning and noise activity. Also zero out the software interrupt counter/timer variables. Wait for 1.6 seconds in order to receive any data that was present. Now check the level of activity during this 1.4 second data buffer. Upon not receiving a 1.4 second data buffer still check the level of activity. The number of valid and intercloud strokes and the number of 2.7 millisecond samples in this 1.4 second buffer must be below a certain level in order to pass the interference test. Upon failing this interference test set the proper error flags and get out of the calibration routine. Passing this test will allow the calibration calculation to proceed. The antenna hardware and the software must be initialized to guarantee that thirteen test pulses get through the first 1.4 second raw data buffer interrupt. Also zero out the software interrupt counter/timer variables. Next call the TEST PULSE routine. Check for an error occurring and exit this routine upon an error. After passing this check proceed to the routine that calculates the constants for the Nose and Wing channels (high and low frequencies). Call the Calculate constants K1 and K2 routine. Upon returning from this routine check for any errors. An error will cause the proper error flags to be set and unity for the above constants to be used. No errors will cause the calculated constants to be used. Show the I/O Processor that the Data processor is a non-calibrated and that a calibration test error was flagged. Disable the calibration mode and mode bit. Enable the standby mode. Show the I/O Processor that the Data Processor is calibrated. Disable the calibration mode and mode bit. Enable the standby mode.

Inputs:
1. CALBUFFR: Buffer of the filtered current stroke data
2. CAL_STR_CNT: Number of strokes in CALBUFFR
3. TK1N: Temporary HF nose magnitude gain adjustment constant
4. TK1 W: Temporary HF wing magnitude gain adjustment constant
5. TK2N: Temporary LF nose magnitude gain adjustment constant
6. TK2 W: Not used.
7. TK3: Not used.
8. COUNTER_1.6_SEC RTCINT: 1.6 second timer/counter
9. COUNTER_133_MS RTCINT: 133 millisecond timer/counter
10. BUFFER_RECEIVED_FLAG: 1.4 second flag for lightning buffer received
11. CAL_BUFFER_COUNTER: Number of strokes in the cal buffer
12. D_NUM_VALID_STROKES: Number of valid strokes
13. D_NUM_INTERCLOUDS: Number of interclouds
14. D_NUM_LOW_FREQ: Number of low frequency groups read from the raw data buffer.
15. D_MODE_DISCRETES: Communication mode and configuration discretes from the I/O Processor Outputs:
1. ERROR_FLAG: Flag to indicate an error
2. CAL_ERROR: Cal error word for transfer to I/O Processor
3. COUNTER_1.6 SEC RTCINT: 1.6 second timer/counter
4. COUNTER_133_MS RTCINT: 133 millisecond timer/counter
5. K1N HF: nose magnitude gain adjustment constant
6. K1 W HF: wing magnitude gain adjustment constant
7. K2N LF: not used.
8. K2 W LF: not used.
9. K3: not used
10. CAL1: Indicator for calibration mode
11. OSTANDBY: Indicator for standby mode
12. TASKACK: Task interrupt acknowledge
13. D_DATA_CONFIG: mode of operation/degradation of data processor.
14. D_FAULT_CODES: Data CPU error flag word
15. D_CAL_FAULT_CODES: Data CPU calibration error flag word
16. TEST_PULSE_WIDTH: Selects the low frequency energy
17. DEL_DMA_DATA: Flag to delete current lightning raw data buffer Subroutines Called:
1. CAL_TEST NEAR OUTPUTS THE CALIBRATION TEST PULSE RATIO'S
2. CAL_K1_K2 NEAR CALCULATES THE CALIBRATION CONSTANTS K1 AND K2 WING AND NOSE
3. CAL_K3 NEAR CALLED BUT RETURN WITH NO CALCULATIONS Description of Module TASKINT Responds to the 1.4 second interrupt. Identify DMA buffer just filled. Setup new DMA buffer and call processing routine. Execute the noise processing routines when necessary. Hardware interrupt0 occurs. Save all registers. Disable all interrupts for critical path processing. See if raw data buffer is full and if so to collect from the hardware the 3 words of low frequency data before proceeding. Get calibration data. Acknowledge interrupt to hardware for reset to hardware only. Determine which buffer was just filled and which buffer to fill next. Enable interrupts and calculate correction values. Now call VFLASH to process data just collected. Restore registers and return from interrupt.

There are two factors affecting the processing of an interrupt.
1. Interrupt latency—the time it takes the CPU to finish the instruction it is executing before vectoring to the CPU interrupt handler.
2. Interrupt response—the time it takes the CPU interrupt handler to vector to the interrupt handler routine of the program.

This interrupt handler routine will only be allowed to interrupt the monitor program. The longest instruction time in relation to interrupt latency will be 16 CPU clock cycles. The interrupt response time is always 42 CPU clock cycles. Interrupt Latency 16 Interrupt Response 42 58 CPU Cycles The total time that it will take from the accurance of an interrupt (INT0) will be 58 CPU clock cycles (10 microseconds) until the start of the TASKINT first code instruction execution. Upon entering this routine a critical path follows which requires that all interrupts be disabled.

Inputs:
1. MASKREG: Mask register
2. DMAOCNTRL: DMA channel 0 control register
3. TRANSCNT0: Word transfer count 0
4. TASKACK: Task interrupt acknowledge Outputs:
1. DATAPTR: Points to first word in raw data buffer
2. XFRCNT: Points to end of raw data buffer
3. C1: Gain adjustment for HNHF for antenna installation
4. C4: Gain adjustment for HWHF antenna installation Subroutines Called:
1. VFLASH NEAR PROCESSES RAW DATA BUFFER JUST COLLECTED Description of Module PWRUPTST Check RAM and PROM for operation. First determine if a coldstart or warmstart is to be preformed. Warmstart condition will save the DX register values in their memory locations and exit this routine. A coldstart will save the DX register and preform a coldstart and upon completion will save the DX register values in their proper memory locations. This test will test RAM using a pattern first of 5's and then of A's. If an error occurs then set the failed_mem flag. Next calculate the EPROM CHECKSUM and verify against the CHECKSUM stored in the EPROMS. If an error occurs then set the FAILED_MEM FLAG. Save the flags stored in the DX register in memory since the RAM has been powered. Finally set the flag to delete the next DMA buffer received due to false triggering from gain change at the antenna.

Inputs:
None
Outputs:
FAIL_MEM: If RAM or EPROM fails this flag is set
1=Shared RAM FAILED
2=MY RAM FAILED
3=SHARED AND MY RAM FAILED
4=EPROM CHECKSUM FAILED
5=EPROM AND SHARED RAM FAILED
6=EPROM AND MY RAM FAILED
7=EPROM, SHARED & MY RAM FAILED
Subroutines Called:
None Description of Module SINCOS This routine finds the sine and cosine of the input angle. SUBROUTINE SINCOS looks up the SIN(CX),COS(CX) in a 1KW table. The quadrant is determined by the two most significant bits. Bits 00=1, 01=2, 10=3 and 11=4. The quadrant is used as an index to call one of four tables. Lookup routines uses Table 18 describes the argument manipulation. To derive the sin and cos, the input angle is broken up into quadrant and arguments. As example:
B15 B14 B13 B12 B11 B10 B09 B08 B07 B06 B05 B04 B03 B02 B01 B00
Q1 Q0 X9 X8 X7 X6 X5 X4 X3 X2 X1 X0 NOT USED
The argument is shifted right until X9 is in the B10 position. Then only the X Bits are retained using an "AND" operation. The resulting argument is denoted as X in the Table 19. X is obtained to read the Table in an inverse manner that is:

$X$=MAX TABLE OFFET ADDRESS–$X$

The look-up table is for the sine and cosine. Table 19 contains just the values for the sine. All the angles listed in the table are multiples of 0.3515625 and are rounded to three digits behind the decimal point only for the purpose of listing the angles in this table. The sine values of the angles are computed using the full value of the angle. The sine values are multiplied by 16384 and then rounded to the nearest whole number before converting to hex and being entered in the table.

TABLE 19

Sin/Cos Quadrant Selection

| SIN ROUTINE | SIN LOOKUP | COS LOOKUP | ANGLE |
|---|---|---|---|
| SQ1 | F(X) | F(/X) | 0 <= ARG < 90 |
| SQ2 | F(/X) | −F(X) | 90 <= ARG < 180 |
| SQ3 | F(X) | −F(/X) | 180 <= ARG < 270 |
| SQ4 | F(/X) | F(X) | 270 <= ARG < 360 |

The maximum path through this routine requires approximately 22.6 microseconds at 6 MHZ.
microseconds at 6 MHZ.
Inputs:
1. REGISTER-CX: AIRCRAFT HEADING (SAF) OUTPUTS:
2. REGISTER-CX: COSINE OF HEADING (B14)
3. REGISTER-AX: SINE OF HEADING (B14)
4. QUAD: QUADRANT OF ANGLE
Outputs:
None
Subroutines Called:
None Description of Module SQRTSUM This procedure calculates the square root of the sum of the squares of 2-16 bit words (cx and bx), and returns the square root as a 16 bit integer in AX. This routine uses a polynomial expansion for fast computation of the result (it flies!). First the registers DX and BP are saved. Next check the two input registers (CX and BX) for being negative, if negative then make positive. Pick the largest of the two numbers for the divisor and make the other the numerator. The answer gives us the index into the table and a resulting fraction. Get the table entry and the table entry plus 1. The difference between these two gives us a remainder. The remainder times the table index gives a result and add to smaller value that was sent to routine. Finally multiply the larger value that was sent to routine by the before result and add to the larger value sent to the routine for the answer.

Inputs:
1. REGISTER-CX: 16 BIT INTERGER NUMBER
2. REGISTER-BX: 16 BIT INTERGER NUMBER OUTPUTS:
3. REGISTER-AX: INTEGER ANSWER
Outputs:
None
Subroutines Called:
None Description of Module START To determine the type of power up required by the processor 41. To save this information in a register until it can be written into RAM variables. Also to save the mode of Processor 41 for future use. This routine reads the configuration register which contains power loss, mode and hardware configuration information. First read the register at 2208EH. Next pull off the power loss bit which is the cold start bit. Upon power loss then do a complete power up initialization. Upon a non-power loss then determine the type of a warm start to perform. There are two types of warm starts. One is for the configuration register not losing power. The second is for the systems RAM not losing power. When the configuration register is powered then perform a cold start but return the mode of the SLDS system to the mode contained in the configuration register after initialization. When the systems RAM is powered then perform a warm start by returning the system to the saved mode. All of the systems data is intact, therefore do not destroy it. Finally go to the Power up test routine when finished.

Inputs:
None
Outputs:
1. DX-REGISTER: HOLDS THE COLD START AND RAM POWERED FLAGS FOR THE PWRUPTST ROUTINE UNTIL WRITTEN INTO THEIR RESPECTIVE RAM VARIABLES.
Subroutines Called:
1. PWRUPTST: NEAR RAM/PROM TEST ROUTINE Description of Module UFPTAC UFPTAC transforms the range, angle, ranges squared from the current cell buffer position to the aircrafts current position. It transforms the old cell info to be in relation to the aircrafts current position for adding new data. It also averages the angle and averages the range. UFPTAC saves TRAXO and TRAYO in order to prevent these values from changing during transformation because this routine is the lowest on the interrupt priority. Then these values are zeroed to ensure that transformation does not happen twice for the same values. Since the above is critical and nothing should interrupt until complete, the above is done with interrupts disabled.! The temporary values of TRAXO and TRAYO are checked for not being zero, which indicates a change between cell buffer and current aircraft position. When the value(s) are zero then this routine is exited. Else the following occurs. The index into the cell buffer is initialized (SI 0). Next the cells are checked to see if they are active. If not active then SI is incremented and the next cell is tested. If SI cellcnt then this routine has reached the end of the buffer and the program is exited. If active the following calculations are preformed. This routine utilizes a fixed reference system to minimize the data loss that occurs through transformation. The fixed reference is the 0 degree heading reference from the I/O Processor. All angles are computed in a clockwise direction. UFPTAC saves the average range to the old cell locations for computing the range square sums. A check is made to determine if this cell was/is at the origin (under the plane). If was then continue, If is then handle. Also check for the cells average range being greater than 375 nm, if so then remove cell. When the cell is greater than 375 nm the number becomes too large to hold in 16 bits. The movement in the X direction is computed and sunned into the sum of the X's as follows.

Sum of $X$'s=Sum of $X$'s+NUMSTR*TRAXO

This method of addition does not attribute any data loss to movement. Next we will compute the average X in order to determine the new average range and the angle theta.

average $X$<sum of $X$'s/numstr

Next we will compute the average Y in order to determine the new average range and the angle theta.

average $Y$<sum of $Y$'s/numstr

Check to see if we have moved to the origin yet. If so then go to the origin handling routine. The new average range (RG) is computed by taking the square root of the sum of the squares of ave X and ave Y.

$RG$=SQRT($X*X+Y*Y$)

Now save the new average range value to be used to calculate the new sum of the Ranges squared. Check again for the average range being zero. Also check for the average range being greater than 375 nm, if so then remove cell. When the cell is greater than 375 nm the number becomes too large to hold in 16 bits. The new angle theta must be calculated at this time. This is done by using a lookup table of the Arc Tangent. This produces an average of the angle to the cell.

New theta<Arctan table.

The sum of the ranges squared has to be translated as the above sum of the ranges was. In order to save time and simplify the math (square root problems) a special equation was utilized.

SUM RGSQ *NEW*<{SUM RGSQ *OLD*
[NUMSTR**RG OLD*RG OLD*]}
[NUMSTR**RG NEW*RG NEW*]

First the RG OLD was squared and then multiplied by the NUMSTR. Next this result was subtracted from the SUM RGSQ OLD. Then the RG NEW is squared and then multiplied by the NUMSTR. This result is then added to the SUM RGSQ OLD to produce the answer SUM RGSQ NEW.

At the bottom of the module is the code to handle cells passing through the origin. Set values to zero and check to see if this is the first time through. Upon first time through then the range squared term must be adjusted in order for the variance value of sigma to stay the same. Second time through then remove the flag and get out.

Inputs:
1. TRAXO: DISTANCE IN X FROM FIXED POINT TO A/C (B2)
2. TRAYO: DISTANCE IN Y FROM FIXED POINT TO A/C (B2)
3. HXNSUM: SUM OF X's TO EACH STROKE HI WORD
4. LXNSUM: SUM OF X's TO EACH STROKE LO WORD (B2)
5. HYNSUM: SUM OF Y's TO EACH STROKE HI WORD
6. LYNSUM: SUM OF Y's TO EACH STROKE LO WORD (B2)
7. HRGSQSUM: SUM OF SQUARES OF RANGES HI WORD
8. LRGSQSUM: SUM OF SQUARES OF RANGES LO WORD (B4)
9. NUMSTR: NUMBER OF STROKES IN CELL
10. ACTIVE: ACTIVE CELL FLAG
11. CELLCNT: TWICE NUMBER OF CELLS IN CELL BUFFER
12. AVE_RANGE: OLD AVERAGE RANGE VALUE (B2)
Outputs:
1. HXNSUM: SUM OF X's TO EACH STROKE HI WORD
2. LXNSUM: SUM OF X's TO EACH STROKE LO WORD (B2)
3. HYNSUM: SUM OF Y's TO EACH STROKE HI WORD
4. LYNSUM: SUM OF Y's TO EACH STROKE LO WORD (B2)
5. THETA_TN: ANGLE OF CELL IN TRUE NORTH SYSTEM (SAF)
6. HRGSQSUM: SUM OF SQUARES OF RANGES HI WORD 7. LRGSQSUM: SUM OF SQUARES OF RANGES LO WORD (B4)
8. NUMSTR: NUMBER OF STROKES IN CELL
9. ACTIVE: ACTIVE CELL FLAG
10. AVE_RANGE: NEW AVERAGE RANGE VALUE (B2)

Subroutines Called:
1. SQRTSUM: NEAR SQUARE ROOT
2. ARCTAN: NEAR ARC TANGENT OF THE SIDE OPPOSITE OVER ADJACENT Description of Module VFLASH Purpose:

This procedure analyzes the lightning data stored in the raw data buffer by the hardware. It ensures that the sequence of data storage has not been corrupt, and filters out extraneous signals not removed by the hardware. The procedure identifies valid return stroke waveforms and processes their data for use in determining the relative range and bearing of the lightning flash from the aircraft. It serves as the calling procedure for the other modules in the main path of the Lightning Analysis function. The low frequency signals are not used but are still processed to keep data format correct. The raw data buffer contains lightning data stored in 2.7 milliseconds over a 1.4 second time frame. It consists of several groups of high frequency magnetic and electric signals, along With pulse width information, followed by one group of the three low frequency magnetic and electric signals. This multi-HI:LOW sequence can be repeated 'N' times. A code is appended to each of the signals for identification. The H-NOSE, H-WING, and E-FIELD high frequency signals are coded 0, 1, 2 respectively. All three low frequency signals are assigned code 3, if the sequence has been correct to this point it is assumed that the low frequency signals are stored in the correct sequence.

The high and low frequency signals are all scaled by 512/5, producing a binary point of 9. Gain adjustments C1 and C4 are scaled by 16,384, resulting in a binary point of 14. The location of the binary point is indicated in the comments by (B) where it may help in understanding the process or result.

Routine Responsibilities:
Step 1. GET_LOW_FREQ: Locates and processes the next valid low freq. group. If the next low freq. is not valid GET_LOW_FREQ will continue to the next and the next until 1) A valid low freq. is found (VALID_LOW_FREQ TRUE) or 2) End of buffer is reached END_OF_BUF TRUE) GET_LOW_FREQ updates CUR_DATA_PTR if a low freq error was detected.
Step 2. GET_HI_FREQ: Locates and processes the largest valid high freq. pulse group. If the next high freq. is not valid GET_HI_FREQ will continue to the next and the next until a valid high freq. is found (VALID_HI_FREQ TRUE) or End of this hi:low section is reached (END_OF_HF TRUE or END_OF_BUF TRUE) GET_HI_FREQ updates CUR_DATA_PTR.
Step 3. If at least 1 valid stroke has been processed in this hi:low group call RANGE and load it into the proper stroke structure.
Step 4. Load all error code values into display variables.
Step 5. During Calibration do not allow any strokes through to the rest of the system and call CALFIX. SKIP STEP 7.
Step 6. Call AIRFIX then set flags for data pending.
Step 7. Clear the DMA buffer just used.

Inputs:
1. DATAPTR: POINTS TO FIRST WORD IN RAW DATA BUFFER
2. XFRCNT: POINTS TO END OF RAW DATA BUFFER
3. RAW DATA BUFFER CONTAINS:
4. H-NOSE, H-WING, E-FIELD HIGH FREQ WORDS Outputs:
CUR_DATA_PTR: Points to the current position in the DMA Buffer
1. CUR_LF_PTR: Points to the current low freq group
2. TL_STROKES: Total of strokes that have been looked at extensively
3. END_OF_BUF: OFFH TRUE, OOH FALSE
4. VALID_LOW_FREQ: OFFH TRUE, OOH FALSE
5. END_OF_HF: OFFH TRUE, OOH FALSE
6. VALID_HI_FREQ: OFFH TRUE, OOH FALSE
7. STRCNT: Total of VALID Strokes located.
8. VALID_STROKES: of valid strokes ASSOCIATED WITH THIS LOW_FREQ.
9. STROKE: Stroke structure telling all about the current processing Subroutines Called:
1. CALFIX: NEAR SAVE STROKE DATA FOR CALIBRATION ROUTINES
2. AIRFIX: NEAR FLASH XN AND YN DETERMINATION
3. GET_HI_FREQ: NEAR Find the next high freq.
4. GET_LOW_FREQ: not used.
5. WAVEFORM: NEAR RANGE COMPUTATION
6. BINBCD: NEAR CONVERT BINARY TO BINARY CODED DECIMAL Description of Module WAVEFORM (Timer2ISR)

This procedure calculates the range to the stroke. First test for close range strike. Calculate the range with:

Range is =32,000/sum of the squares

Adjust the range based on the pulse width:

temp11=32000/Sum of squares

TEMP_*HMP*=pulse_width;

temp12=TEMP_*HMP;* temp12=temp12/15

TEMP_WORD=temp11/temp12;

if(TEMP_WORD>200)TEMP_WORD=200;

*STR_RNG*[STRCNT]=TEMP_WORD;/*range value*/

Set the flag NSTROKDATA to 1. This tells VFLASH there is range data saved in STR_RNG[i].
Inputs:
HNSmax, HEWmax, Emax
H-NOSE, H-WING, E-FIELD HIGH FREQ WORDS
NSTROKDATA
Outputs:
STR_RNG: range to flash from A/C (B2)

I claim:
1. An apparatus for determining the location of lightning strokes, each lightning stroke generating electric (E) and magnetic (H) field components said apparatus comprising:
receiving means for receiving separately the electric (E) and magnetic (H) field components of a lightning stroke and for generating electrical signals associated with said E and H field components and said E component is proportional to the area of electric field antenna and the distance from top of the radome to the base, said electrical signals being characterized by measurable components;

means coupled to said receiving means for determining the direction to said lightning stroke relative to said apparatus by operating upon said measurable components associated with both said E and H field components and located in the base of the radome;

means coupled to said receiving means for determining the distance to said lightning stroke from said apparatus by operating upon said E and H field components, said distance determining means comprising:
1. means for measuring, at a first magnitude of a received H field component of said lightning stroke; and
2. means for measuring rise time to peak of a received E field component of said lightning stroke; and
3. means for determining the distance to said lightning stroke as an inverse function of said first magnitude and time to peak of first E field component; and means for containing all receiving means and determining means within single package.

2. An apparatus for determining the location of lightning strokes, each lightning stroke generating electric (E) and magnetic (H) field components said apparatus comprising:

receiving means for receiving separately the electric (E) and magnetic (H) field components of a lightning stroke and for generating electrical signals associated with said E and H field components and said E component is proportional to the area of electric field antenna and the distance from top of the radome to the base, said electrical signals being characterized by measurable components;

means coupled to said receiving means for determining a direction to said lightning stroke relative to said apparatus by operating upon said measurable components associated with both said E and H field components and located in the base of the radome;

means coupled to said receiving means for determining a distance and an intensity to said lightning stroke from said apparatus by operating upon said H field component and located in the base of the radome, said distance and intensity determining means comprising:
1. means for measuring a first magnitude of a received H field component of said lightning stroke;
2. means for measuring rise time to peak of a received E field component of said lightning stroke;
3. means for determining said distance to said lightning stroke as functions of sold first magnitude and time to peak of first E field component; and
4. means for collecting a predetermined number of said first H magnitude and said first E field components into a cell group to determine said intensity of said lightning cells;

means for containing all receiving means and determining means within single package.

3. An apparatus in accordance with claim 2 wherein said cell comprises,

SUM of $X$'s=SUM of $X$'s+(NUMSTR*TRAXO)

SUM of $Y$'s=SUM of $Y$'s+(NUMSTR*TRAYO)

$X$=sum of $X$'s/numstr $X$=sum of $X$'s/numstr $RG$=Square root $(X*X+Y*Y)$

Wherein SUM of X's is the sum of said lightning strokes along said apparatus x axis, SUM of Y's is the sum of said lightning strokes along said apparatus y axis, NUMSTR is the number of said lightning signals, TRAXO is the movement of said apparatus along said x axis, TRAXO is the movement of said apparatus along said y axis, and RG is a new distance from said apparatus.

4. An apparatus in accordance with claim 2 wherein said intensity of said lightning cell is determined by counting said lightning strokes over said predetermined time.

5. An apparatus in accordance with claim 2 wherein said predetermine time is substantially four minutes.

6. An apparatus in accordance with claim 2 wherein said intensity of said lightning cell is determined by intercloud lightning.

7. An apparatus in accordance with claim 2 wherein said intercloud lightning is displayed at the calculated angle of the display screen for predetermined time.

8. An apparatus in accordance with claim 2 wherein said predetermined time is 1 minute.

9. An apparatus in accordance with claim 2 or 1 wherein said predetermined antenna is 66 square inches and the distance is 1 inch from base.

* * * * *